(12) United States Patent
Stay et al.

(10) Patent No.: US 8,703,232 B2
(45) Date of Patent: Apr. 22, 2014

(54) METHOD OF FORMING A MICROSTRUCTURE

(75) Inventors: Matthew S. Stay, St. Paul, MN (US); Mikhail L. Pekurovsky, Bloomington, MN (US); Cristin E. Moran, St. Paul, MN (US); Matthew H. Frey, Cottage Grove, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 465 days.

(21) Appl. No.: 13/001,718

(22) PCT Filed: Jun. 25, 2009

(86) PCT No.: PCT/US2009/048571
§ 371 (c)(1),
(2), (4) Date: Dec. 28, 2010

(87) PCT Pub. No.: WO2010/002679
PCT Pub. Date: Jan. 7, 2010

(65) Prior Publication Data
US 2011/0111182 A1    May 12, 2011

Related U.S. Application Data

(60) Provisional application No. 61/076,731, filed on Jun. 30, 2008.

(51) Int. Cl.
*B05D 5/06* (2006.01)

(52) U.S. Cl.
USPC ........ 427/164; 427/97.3; 427/97.9; 427/98.1; 427/99.1; 427/99.5; 427/108; 427/117; 427/118; 427/163.1; 427/163.4; 427/256; 427/259; 427/272; 427/304; 427/437; 427/443.1

(58) Field of Classification Search
USPC ........... 427/97.9, 99.5, 256, 304, 443.1, 97.3, 427/98.1, 99.1, 437, 162, 163.1, 164, 163.4, 427/259, 272, 108, 117, 118
See application file for complete search history.

(56) References Cited

U.S. PATENT DOCUMENTS 3,322,053 A    5/1967  Good
4,403,818 A *  9/1983  Kleinbohl .................... 439/36
(Continued)

FOREIGN PATENT DOCUMENTS

JP    2002 158208 A    5/2002
RU    2 230 391 C2     6/2004
(Continued)

OTHER PUBLICATIONS

International Search Report, PCT/2009/048571, Feb. 10, 2010, 4 Pages.
(Continued)

*Primary Examiner* — Elizabeth Burkhart
(74) *Attorney, Agent, or Firm* — Gregory D. Allen

(57) ABSTRACT

The present disclosure describes an article and a method of forming a microstructure. The method includes providing a substrate having a structured surface region comprising one or more recessed features with recessed surfaces. The structured surface region is substantially free of plateaus. The method includes disposing a fluid composition comprising a functional material and a liquid onto the structured surface region. The method includes evaporating liquid from the fluid composition. The functional material collects on the recessed surfaces such that a remainder of the structured surface region is substantially free of the functional material.

9 Claims, 15 Drawing Sheets

(56) References Cited

U.S. PATENT DOCUMENTS

| | | | |
|---|---|---|---|
| 4,830,880 A | 5/1989 | Okubi | |
| 5,137,611 A | 8/1992 | Roberts et al. | |
| 5,300,263 A | 4/1994 | Hoopman et al. | |
| 5,382,317 A | 1/1995 | Thomas | |
| 5,439,621 A | 8/1995 | Hoopman | |
| 5,519,539 A | 5/1996 | Hoopman et al. | |
| 5,670,096 A | 9/1997 | Lu | |
| 5,917,664 A | 6/1999 | O'Neill et al. | |
| 5,962,148 A * | 10/1999 | Nishimura et al. | 428/522 |
| 6,077,560 A | 6/2000 | Moshrefzadeh et al. | |
| 6,111,696 A | 8/2000 | Allen et al. | |
| 6,198,051 B1 | 3/2001 | Moshrefzadeh et al. | |
| 6,280,063 B1 | 8/2001 | Fong et al. | |
| 6,290,685 B1 | 9/2001 | Insley et al. | |
| 6,354,709 B1 | 3/2002 | Campbell et al. | |
| 6,375,871 B1 | 4/2002 | Bentsen et al. | |
| 6,386,699 B1 | 5/2002 | Ylitalo et al. | |
| 6,431,695 B1 | 8/2002 | Johnston et al. | |
| 6,451,191 B1 | 9/2002 | Bentsen et al. | |
| 6,461,678 B1 * | 10/2002 | Chen et al. | 427/304 |
| 6,521,325 B1 | 2/2003 | Engle et al. | |
| 6,632,343 B1 | 10/2003 | Farnworth et al. | |
| 6,649,249 B1 | 11/2003 | Engle et al. | |
| 7,105,809 B2 | 9/2006 | Wood et al. | |
| 7,160,583 B2 * | 1/2007 | Frey et al. | 427/437 |
| 7,223,364 B1 | 5/2007 | Johnston et al. | |
| 7,235,415 B2 | 6/2007 | Mikoshiba | |
| 7,244,669 B2 | 7/2007 | Sirringhaus et al. | |
| 7,777,832 B2 | 8/2010 | Richard et al. | |
| 2003/0108664 A1 | 6/2003 | Kodas et al. | |
| 2003/0129301 A1 * | 7/2003 | Engle et al. | 427/146 |
| 2005/0106360 A1 | 5/2005 | Johnston et al. | |
| 2005/0120902 A1 | 6/2005 | Adams | |
| 2005/0121782 A1 | 6/2005 | Nakamura | |
| 2006/0072199 A1 | 4/2006 | Morishita et al. | |
| 2006/0108062 A1 * | 5/2006 | Smith et al. | 156/272.2 |
| 2006/0146571 A1 | 7/2006 | Whitney et al. | |
| 2006/0223318 A1 | 10/2006 | Tagawa | |
| 2007/0024994 A1 | 2/2007 | Whitney et al. | |
| 2007/0134784 A1 | 6/2007 | Halverson et al. | |
| 2007/0220744 A1 | 9/2007 | Kitaoka | |
| 2007/0231541 A1 | 10/2007 | Humpal et al. | |
| 2007/0235902 A1 * | 10/2007 | Fleming et al. | 264/400 |
| 2008/0095988 A1 * | 4/2008 | Frey et al. | 428/173 |

FOREIGN PATENT DOCUMENTS

| | | |
|---|---|---|
| WO | 92/02336 A1 | 2/1992 |
| WO | 98/50806 | 11/1998 |
| WO | WO 00/42453 | 7/2000 |
| WO | 00/73083 A1 | 12/2000 |
| WO | 2010/002679 A2 | 1/2010 |

OTHER PUBLICATIONS

Written Opinion of the International, PCT/2009/048571, Feb. 10, 2010, 11 Pages.

Journal of Power Sources, vol. 128, Issue 1, pp. 54-60.

Biomaterials, vol. 20, Issues 23-24, pp. 2363-2376.

Hendriks, C.E., et al., "Invisible Silver Tracks Produced by Comgining Hot-embossing and Inkjet Printing", Advanced Functional Materials, Wiley VCH, Wienheim, DE, vol. 18, No. 7, (Apr. 11, 2008), pp. 1031-1038.

Yi, Cui, et al., "Integration of Colloidal Nanocrystals into Lithographically Patterned Devices", Nano Letters, vol. 4, No. 6, (Jun. 1, 2004) pp. 1093-1098.

* cited by examiner

METHOD OF FORMING A MICROSTRUCTURE

RELATED APPLICATIONS

The present application claims priority to U.S. Provisional Application Ser. No. 61/076,731, filed Jun. 30, 2008.

FIELD

The present disclosure relates to a method of forming a microstructure.

BACKGROUND

Polymeric films with conductive material grids have a variety of commercial applications. In some applications, it is desirable to have a conductive grid being invisible or nearly invisible to the unaided eye and supported on a transparent polymeric substrate. Transparent conductive sheets have applications for resistively heated windows, electromagnetic interference (EMI) shielding layers, static dissipating components, antennas, touch screens for computer displays, and surface electrodes for electrochromic windows, photovoltaic devices, electroluminescent devices and liquid crystal displays.

Substrates having conductive features have been described. Patterning of micron scale features on substrates based on photolithographic techniques has resulted in inconsistent patterning and upper limitations on pattern size, particularly for flexible substrates. There is a need for selectively forming micron scale features on substrates in a consistent manner, particularly for large patterns with small feature sizes and particularly for flexible substrates, without the use of photolithography.

SUMMARY

The present disclosure describes an article and methods for forming microstructures. More specifically, methods are provided for selectively disposing functional materials onto substrates having structured surface regions.

In one aspect, a method of forming a microstructure is provided. The method includes providing a substrate having a structured surface region comprising one or more recessed features with recessed surfaces. The structured surface region is substantially free of plateaus. The method includes disposing a fluid composition comprising a functional material and a liquid onto the structured surface region. The method includes evaporating the liquid from the fluid composition and collecting the functional material on the recessed surfaces such that the remainder of the structured surface region is substantially free of the functional material.

In another aspect, a method of forming a microstructure is provided. The method includes providing a substrate comprising a metallized structured surface region comprising a metal layer disposed on a surface of the structured surface region. The metallized structured surface region comprises one or more recessed features having recessed surfaces. The metallized structured surface region is substantially free of plateaus. The method includes disposing a fluid composition comprising a resist material and a liquid onto the metallized structured surface region. The method includes evaporating liquid from the fluid composition and collecting the resist material on the recessed surfaces such that the remainder of the metallized structured surface region is substantially free of the resist material.

In another aspect, an article comprising a microstructure is provided. The article includes a transparent substrate comprising a major surface having a structured surface region. The structured surface region comprises one or more recessed features having recessed surfaces, and is substantially free of plateaus. The article includes an electrically conductive material adjacent to and in contact with a recessed surface of the structured surface region. The article includes a remainder of the structured surface region being substantially free of the electrically conductive material. The article includes an adhesive or a refractive-index matching material. The adhesive or the refractive-index matching material comprises a first surface and a second surface. The first surface contacts the structured surface region and the second surface is parallel to the major surface.

BRIEF DESCRIPTION OF THE DRAWINGS

FIG. 3 A2-B2 is a schematic representation of a structured surface region and a structured surface region with an applied coating, respectively.

DETAILED DESCRIPTION

Although the present disclosure is herein described in terms of specific embodiments, it will be readily apparent to those skilled in the art that various modifications, rearrangements, and substitutions can be made without departing from the spirit of the invention. The scope of the present invention is thus only limited by the claims appended herein.

The recitation of numerical ranges by endpoints includes all numbers subsumed within that range (e.g., 1 to 5 includes 1, 1.5, 2, 2.75, 3, 3.8, 4, and 5).

As included in this specification and the appended claims, the singular forms "a", "an", and "the" include plural referents unless the content clearly dictates otherwise. Thus, for example, reference to a composition containing "a compound" includes a mixture of two or more compounds. As used in this specification and appended claims, the term "or" is generally employed in its sense including "and/or" unless the content clearly dictates otherwise.

Unless otherwise indicated, all numbers expressing quantities or ingredients, measurement of properties and so forth used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings of the present disclosure. At the very least, each numerical parameter should at least be construed in light of the number of reported significant digits and by applying ordinary rounding techniques. Notwithstanding that the numerical ranges and parameters setting forth the broad scope of the disclosure are approximations, the numerical values set forth in the specific examples are reported as precisely as possible. Any numerical value, however, inherently contains errors necessarily resulting from the standard deviations found in their respective testing measurements.

Substrates useful for forming microstructures of the present disclosure comprise a structured surface region having one or more recessed features with recessed surfaces, the structured surface region being substantially free of plateaus. A fluid composition is disposed on the structured surface region of the substrate. The fluid composition comprises a liquid and a functional material. At least a portion of the liquid from the fluid composition evaporates such that the functional material collects on the recessed surfaces. As the volume of the fluid composition decreases on the structured surface region, a remainder of the structured surface region is left substantially free of the functional material. The combination of the fluid composition and the structured surface region of the substrate can cause dewetting of the fluid composition into the recessed features as the liquid evaporates from the fluid composition.

Figure 1:
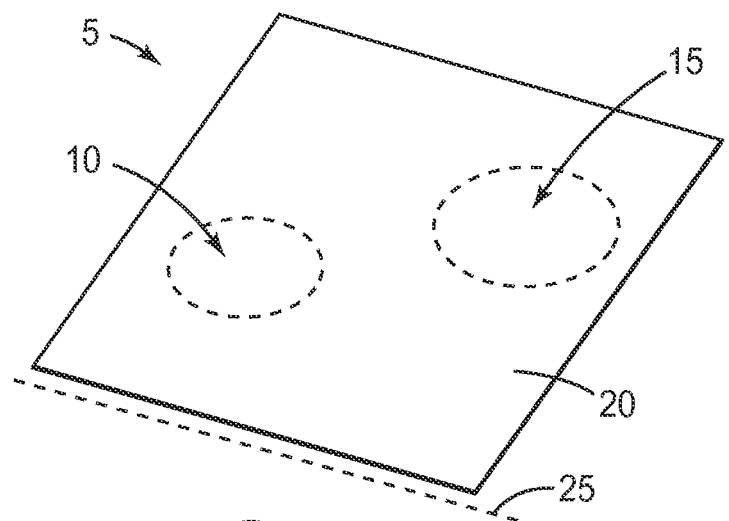
FIG. 1 is a schematic representation of a substrate having a structured surface region.

FIG. 1 illustrates a substrate 5 having a structured surface region 10, 15. In some embodiments, substrate 5 can have structured surface regions 10, 15 positioned in different regions of the substrate 5. Substrate 5 comprises a major surface 20 having a major surface contour 25.

Substrates having a structured surface region can be, for example, a film, a sheet, a web, a belt, a roller, a drum, a ribbon, or other three dimensional shapes or structures, or the like. The substrate can be formed, for example, from a polymeric material, a metallic material, a ceramic material, or combinations thereof. The material selected for the substrate generally has properties suitable for a particular application. Some of these properties include physical, chemical, optical, electrical, and thermal. Suitable polymeric materials for substrates include, for example, thermoplastics such as poly (meth)acrylates, polycarbonates, polyesters, polyolefins, polyimides, and the like. Suitable metallic materials include, for example, indium, silver, gold, lead, and the like. Suitable ceramic materials include, for example, oxides, nitrides, borides, carbides, and the like.

The structured surface region of the substrate can be generally described in terms of an average elevation. The average elevation of the structured surface region can be defined as an imaginary surface associated therewith i) lacking protrusive features or intrusive features, ii) being parallel to a major surface contour of the substrate in the structured surface region, and iii) residing at an elevation within the projected area of the structured surface region that is equal to the mean elevation calculable in terms of the points that define the nearby protrusive features and the intrusive features. The major surface contour of the substrate can be referred to as the shape of the surface of the substrate surface, regardless of the shape of the protrusive features and the intrusive features of the structured surface region. For example, a flat film has a major surface contour which is a plane in the form of a flat sheet. In the present disclosure, the average elevation within the structured surface region of the substrate can be defined as the sum of the elevation of points within a region (e.g., the elevation of any point being defined as its position along a coordinate orthogonal to the plane of the substrate) divided by the number of points.

Structured surface regions comprise protrusive features and intrusive features. Protrusive features of a structured surface region can generally be described as features having surface points that lie above the average elevation of the structured surface region. Intrusive features (e.g., recessed features) of the structured surface region can generally be described as features having surface points that lie below the average elevation of the structured surface region. In some embodiments, an intersection of the average elevation with the surface of the structured surface region itself can be generally described as the boundary between the protrusive features and the intrusive features.

Figure 2A:
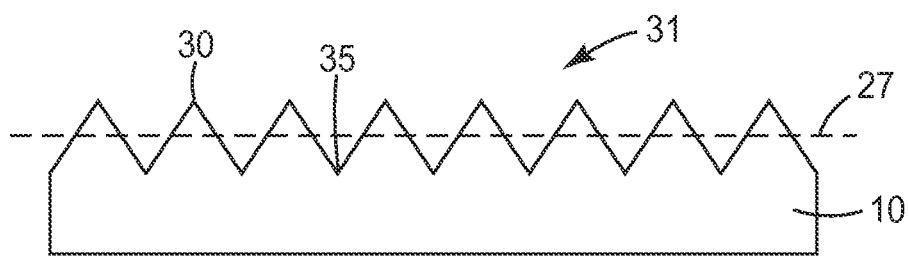
FIG. 2 A-D is a schematic representation of structured surface regions.
Figure 2B:
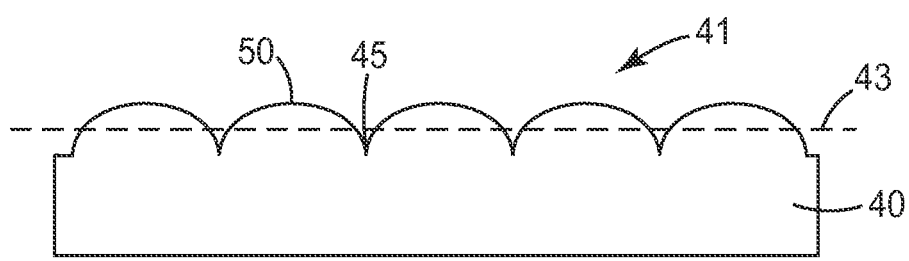
Figure 2C:
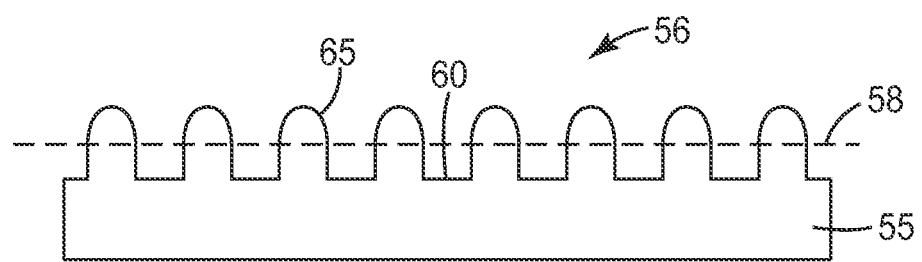
Figure 2D:
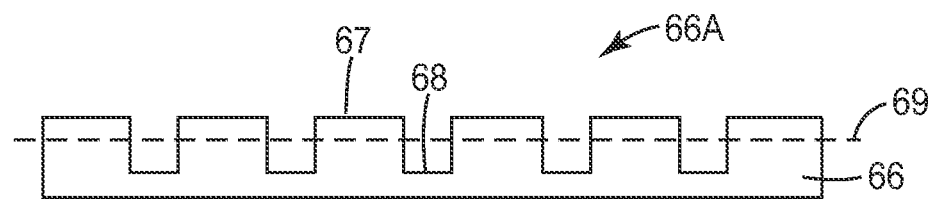

FIG. 2A-D illustrate some examples of substrates 10, 40, 55, 66 comprising structured surface regions 31, 41, 56, 66A having an average elevation 27, 43, 58, 69, respectively. The average elevation 27, 43, 58, 69 lies between the elevation of points that lie on the protrusive features 30, 50, 65, 67 and the elevation of points that lie on adjacent intrusive features 35, 45, 60, 68. More specifically, FIG. 2A illustrates a structured surface region 31 comprising prismatic or pyramidal type protrusive features 30. FIG. 2B illustrates a structured surface region 41 comprising hemispherical protrusive features 50, and the like. FIG. 2C illustrates a structured surface region 56 comprising bullet-like protrusive features 65. FIG. 2D illustrates a bi-level structured surface region 66A comprising protrusive plateau features 68.

In some instances, a substrate comprising a structured surface region can have features that are relatively free of curvature (e.g., flat feature). The features that are relatively free of curvature are referred to herein as flat. Some flat features can also be generally described as being parallel to the major surface contour of the substrate. The latter flat features are referred to herein as "flat and parallel." In other embodiments, the flat feature can be skewed or generally nonparallel relative to the major surface contour. Some portions of flat features can generally have curvatures that are less than $100 \text{ m}^{-1}$, less than $1 \text{ m}^{-1}$, or even less than $0.1 \text{ m}^{-1}$, In some embodiments, a structured surface region can be described as comprising an extended area that is flat and parallel, in combination with protrusive features, such that the flat and parallel region can be referred to as a land area. By extended, what is meant is that flat and parallel land area or areas are present along the base edges of multiple protrusive features. In some embodiments the extended and flat and parallel land area surrounds one or more protrusive features, as would be the case, for example, for a flat land area surrounding each of a hexagonal array of protrusive hemispheres of diameter D that are spaced by a dimension greater than D. In some embodiments, the structured surface regions of a substrate can be described as comprising an extended area being flat and parallel in combination with intrusive features or recessed features. In some embodiments, the structured surface regions can be described generally as lacking flat and parallel portions such that the surfaces have curvature or are skewed with respect to the major surface contour. In other embodiments, a combination of surfaces having curvature and being skewed with respect to the major surface contour can be described for structured surface regions generally lacking flat and parallel portions. In general, a protrusive feature having a portion or surface area being flat and parallel is described herein as a "plateau."

Substrates having a structured surface region generally comprise a combination of protrusive features and intrusive features. Some of these features can function to exclude, retain, or provide for a combination of excluding or retaining fluid compositions disposed onto a structured surface region. The surfaces of the protrusive or intrusive features can be smooth, partially smooth, textured, or a combination thereof. The features can be nano-replicated, micro-replicated, macro-replicated and the like. Some structured surface regions can comprise nano-replicated, micro-replicated, and macro-replicated features and patterns as similarly described in U.S. Pat. No. 6,649,249 (Engle et al.) and U.S. Pat. No. 7,105,809 (Wood et al.). In some embodiments, the structured surface region of the substrate can include regular or random features. These features can be spatially located throughout the structured surface region.

Structured surface regions having intrusive features can be referred to as recessed features or recesses. Recessed features, for example, can be referred to as recesses, wells, cavities, regions, pockets, channels, and the like. Recessed features having recessed surfaces provide a location within or on the structured surface region to retain a fluid composition and the functional material after evaporation of liquid. Recessed features can have a volume with dimensions such as diameter, radius, height, width and length. The fluid composition can be retained by walls and other features located on or within the structured surface region. A base (e.g., lowest elevation) of the recessed feature can generally refer to a location within the recessed feature having points lying farthest from an average elevation. In some embodiments, a recessed feature can be positioned separately from another recessed feature by adjacent protrusive features.

In some embodiments, a structured surface region comprises intermediate recessed features (e.g., recessed features having intermediate elevations). Intermediate recessed features can generally be described as intrusive features having points that lie below an average elevation, and having an intermediate elevation with respect to the elevation of one or more recessed features. For example, structured surface regions can provide a first recessed feature having a first elevation and a second recessed featured having a second elevation. The first elevation can be distinguished from the second elevation such that the first elevation is greater the second elevation. The second elevation of the second recessed feature can be an intermediate recessed feature.

Protrusive features of the structured surface regions can be features that represent a departure or deviation away from an otherwise flat surface region. Protrusive features of the structured surface region can influence the flow and delivery of a fluid composition onto a substrate. In some embodiments, protrusive features separate recessed features, and can guide or provide direction for the movement of the fluid composition into the recessed features as liquid is evaporated from the fluid composition. The structured surface region, substantially free of plateaus, can influence the flow of the fluid composition, and subsequent collection of the functional material into the recessed features. Some examples of protrusive features positioned on or within the structured surface region include, for example, peaks, nodules, posts, lumps, ridges, and the like, or combinations thereof. Examples of ridges include raised linear features with rounded tops, for example, as would be defined by arraying half-cylinders, rectangular flat face down, on a flat surface. Some other examples of ridges include raised linear features with a pointed apex and two facets, as would be defined by arraying triangular prisms, flat face down, on a flat surface.

Structured surface regions "substantially free of plateaus" can be generally referred to as lacking, or substantially lacking, protrusive features that include a portion of their surface area being flat and parallel, as defined above. In a preferred embodiment, the structured surface region contains no plateaus. Structured surface regions "substantially free of plateaus" are particularly effective for controlling the placement of functional material contained in a fluid composition onto recessed surfaces. The structured surface regions of the present disclosure can be selected in combination with a fluid composition such that the fluid composition flows or is directed into the recessed features as the liquid evaporates from the fluid composition. As the volume of the fluid composition decreases or dewets from the protrusive features of the structured surface region, the functional material can collect on the recessed surfaces of the recessed features as directed by the protrusion. It will be understood by one of ordinary skill in the art that a protrusive feature that is not a plateau can include on some scale, for example, the atomic scale, a portion of its surface that is flat and parallel, as long as the protrusive feature functions to isolate the functional material of the fluid composition to the recessed features.

Structured surface regions have been described. Some suitable examples of structured surface regions having a combination of protrusive features and intrusive features comprise linear prisms, pyramids, semi-ellipsoids, cones, nonlinear prisms, and the like, or combinations thereof. In some embodiments, linear prisms can include, for example, triangular prisms, pentagonal prisms, and the like, or combinations thereof. In some embodiments, pyramids can include, for example, square pyramids, pentagonal pyramids, hexagonal pyramids, and the like, or combinations thereof. The description of a surface as comprising linear prisms means that the surface topography is that which would result from the fusion of linear prisms to a flat surface, the contact surface of each linear prism to the flat surface being a face that is parallel to the axis of the prism. The description of a surface as comprising a pyramid means that the surface topography is that which would result from the fusion of a pyramid to a flat surface, the contact surface of the pyramid being a face of the pyramid.

In some embodiments, the geometry of the structured surface region can be described as hierarchical. For example, within the structured surface region, recessed features can have random, partially random, or precisely spaced features positioned on the surfaces or walls of the recessed features, on raised regions of the recessed features, and within the recessed features. The surfaces of the recessed features can include protrusive features on a shorter length scale than that characteristic of the recessed feature itself, for example. In some contexts herein, protrusive features and intrusive features are features commonly referred to as topographical features.

Protrusive features that are not plateaus can vary in the curvature or sharpness at the apex. The sharpness can range up to one extreme that is describable as the result of the protrusive feature being defined by two or more facet that converge at the apex, for example at an angle less than 120 degrees, even less than 90 degrees, even less than 45 degrees, or even less than 20 degrees. The sharpness can range down to another extreme where the protrusion has the shape at its apex of a cylinder, sphere, or ellipsoid with curvature of, for example, approximately $150^{m-1}$ (radius of curvature of approximately 6.7 mm). The sharpness of the apex of a protrusive feature that is not a plateau may exist between the aforementioned extremes.

Other examples of recessed features include conical recessed feature having angular, planar recesses, and truncated pyramid recessed features with angular, planar walls. In some embodiments, the recessed features of the structured surface region can be located separately from each other with protrusive features, substantially free of plateaus. The combination of protrusive features and intrusive features can promote and direct the dewetting of the fluid composition. As liquid is removed, the functional material can collect on the recessed surfaces of the recessed features, and the remainder (e.g., protrusive regions) of the structured surface region can be left substantially free of the functional material.

Some of the features of the structured surface region can be formed or positioned on a nano-scale, micro-scale, macro-scale, and the like. Similarly, features can be provided on the surfaces of the protrusive features, the intrusive features, and the like, or combinations thereof. Generally, the structured surface region includes features such that at least two dimensions of the features are microscopic. Microscopic features are sufficiently small so as to require an optic aid to the naked eye to determine their shape. In some embodiments, the dimensions of the topographical features can range up to about one millimeter or less in at least two of the three possible dimensions (in/out of the plane of the structured surface region, and in each direction along the plane of the structured surface region). In other embodiments, the dimensions of the topographical features can range up to about 500 micrometers in at least two of the three possible dimensions. In yet other embodiments, the dimensions of the topographical features can range up to about 250 micrometers in at least two of the three possible dimensions.

In some embodiments, it is preferred that one or more dimensions of a topographical feature, as part of a structured surface region, be less than a desired magnitude. For example, in some embodiments, it is preferred that the width of a recessed feature in the form of a channel is less than 100 micrometers, more preferably less than 50 micrometers, even more preferably less than 25 micrometers, and most preferably less than 10 micrometers.

The topographical features may have a desired characteristic length (such as length measured along a given direction) and a desired featured density (features per unit projected area of the structured surface region). In some embodiments, a feature can be such that its dimensions in three orthogonal directions (e.g., normal to the plane of the structured surface region, and in each of two orthogonal directions along the plane of the structured surface regions) are equal, and thus all equal to its characteristic length. In some embodiments, a feature can be such that the characteristic length in one or more directions is somewhat longer, or even much longer, than its dimensions in the other direction or directions. In some embodiments, a feature can be such that the characteristic length in one or more directions is somewhat shorter, or even much shorter, than its dimensions in the other direction or directions. Examples of characteristic lengths for topographical features include the length of a channel, the width of a channel, the width of a hemispherical protrusion, the length of a ridge, the width of a ridge, the height of a pyramidal protrusive feature, and the height of a hemispherical protrusive feature.

In some embodiments, topographical features of the structured surface region have a characteristic length in one or more directions of 500 micrometers or less. In other embodiments, the characteristic length is 100 micrometers or less, and in other embodiments, the characteristic length in one or more directions is 10 micrometers or less. In some embodiments, the characteristic length in one or more directions is at least 1 nanometer. In other embodiments, the characteristic length in one or more directions is at least 10 nanometers, and in another embodiment, the characteristic length is at least 100 nanometers. In some embodiments, the characteristic length in one or more directions of the one or more topographical features of the structured surface region lies in a range of about 500 micrometers to about 1 nanometer, in other embodiments in a range of about 100 micrometers to about 10 nanometers, and in yet other embodiments in a range of about 10 micrometers to about 100 nanometers. Different embodiments result from the combination of the aforementioned values and ranges of values with the aforementioned characteristic length and shape descriptions (e.g., widths, lengths, and heights of ridges, channels, hemispheres, and pyramids).

In some embodiments, the topographical feature density of the structured surface region can be at least range of 10 features or greater per square millimeter ($mm^2$). In some embodiments, the structured surface region can have a topographical feature density of greater than 100 features or greater per $mm^2$, in other embodiments, a topographical feature density of greater than 1,000 features or greater per $mm^2$, and in other embodiments a topographical feature density of greater than 10,000 features per $mm^2$. As an example of topographical feature density, a structured surface region having a square array of 100 micrometer hemispherical protrusive features spaced in both repeat directions at 115 micrometers has a protrusive feature density of approximately 75 protrusive features per $mm^2$. For the same geometry, the density of narrow recessed channels between adjacent hemispheres is approximately 150 per $mm^2$.

In some embodiments, the topographical features are distributed as an array across a structured surface region (e.g., a one-dimensional array or a two-dimensional array, for example a square array or a hexagonal array). In some of such embodiments, it is preferred that the uniformity (e.g., reproducibility) of the dimensions of topographical features of the structured surface region be high. As a measure of uniformity, the standard deviation of the length of a particular dimension of the repeating features is preferably less than 25 percent of the average magnitude of that length, more preferably less than 10 percent, even more preferably less than 5 percent. In some such embodiments, it is preferred that the uniformity of the density of topographical features of the structured surface region be high. As a measure of high uniformity for the density of topographical features in a structured surface region, the standard deviation of the density of topographical features, measured for sub-regions having no larger than 1/10th the projected area of the structured surface region itself, is preferably less than 25 percent, more preferably less than 10 percent, most preferably less than 5 percent.

In some embodiments, features of the structured substrate region can be present on a regular repeating basis, on a random basis, and the like, or combinations thereof. In other embodiments, the features can be present over a portion of the entire area of the structured surface region, or present over the entire area of the structured surface region. In some embodiments, features can be present in the recessed features of the structured surface region, present on the protrusive features of the structured surface region, and the like, or combinations thereof.

In some embodiments, the structured surface region comprises one or more intrusive features (e.g., recessed features), such that the intrusive features and the protrusive features are generally uniform. In some embodiment, the intrusive features and the protrusive features of the structured surface region are non-uniform. For example, the structured surface region can have intrusive features and protrusive features having different dimensions across a portion of the structured surface region. In some embodiments, a first set of intrusive features and protrusive features can have a first set of dimensions, and a second set of intrusive features and protrusive features can have a second set of dimensions. The first set of intrusive features and protrusive features and the second set of intrusive features and protrusive regions can be uniformly distributed or randomly distributed across the structured surface region of the substrate. In some embodiments, the fluid composition can reside in a portion of the recessed feature having dimensions suitable for retaining the fluid composition.

In one embodiment, the substrate having a structured surface region can be a brightness enhancement film (BEF) as described in U.S. patent application Ser. No. 11/283,307 (Richard et al.). In another embodiment, the substrate having a structured surface region can be a polymer film with surface comprising pyramids as described in U.S. patent application Ser. No. 11/193,052 (US20070024994). In another embodiment, the substrate having a structured surface region can be a microlens film under the trade designation MICRO OPTICS MICROLENS ARRAY commercially available from Leister Process Technologies, Axetris Microsystems Division of Riedstrasse, Switzerland. Microlens arrays have been described in U.S. Pat. No. 5,300,263 (Hoopman et al.), U.S. Pat. No. 5,439,621 (Hoopman), and U.S. Patent Application Publication No. 2006/0072199 (Morishita et al.). In one embodiment, the substrate comprises a microreplicated substrate.

The substrate having a structured surface region can be selected with features that promote or provide for a fluid composition to flow into recessed features. As a liquid is evaporated from the fluid composition disposed on the structured surface region, the fluid composition can dewet from the protrusive features of the structured surface region due to capillary pressure gradients. The capillary pressure gradients can form as a result of a curved air-liquid interface which forms as the fluid composition dries over the structured surface region. The dewetting of the fluid composition from the protrusive features can be manipulated by adjusting the rheology (e.g. viscosity) and surface tension of the fluid composition and the surface energy of the substrate. During evaporation of the liquid from the fluid composition, the volume occupied by the fluid composition can decrease leaving the functional material deposited within the recessed features having recessed surfaces.

In the method of the present disclosure, a fluid composition is disposed onto a substrate having a structured surface region. The fluid composition comprises a functional material and a liquid. The liquid is generally not reactive with the functional material. Liquid is evaporated from the fluid composition such that the volume of the fluid composition decreases relative to the volume of the fluid composition when it initially was disposed on the structured surface region, while the concentration of the functional material increases. The fluid composition dewets from the protrusive regions of the structured surface region. The fluid composition flows into at least a portion of the recessed features flowing or directed away from the protrusive regions. The functional material collects on at least a portion of the recessed surfaces of the recessed features during evaporation of the liquid. The remainder of the structured surface region is left substantially free of the functional material.

In some embodiments, a fluid composition can be formulated such that the surface tension of the fluid composition matches the surface energy of the structured surface region of the substrate. This can result in low contact angles and strong wetting of the fluid composition onto the structured surface region of the substrate. As a result, the fluid composition will tend to flow from the protrusive regions (e.g., peaks) as the liquid evaporates, leaving the protrusive regions substantially free of the fluid composition. The term "substantially free" refers to less than five weight percent of the remainder of the fluid composition, after evaporation, residing on the protrusive regions of the substrate. In some embodiments, less than one percent of the fluid composition can reside on the protrusive regions of the substrate. As the liquid evaporates, the functional material can collect on the recessed surfaces of the recessed features of the structured surface region.

Suitable liquids of the fluid composition include liquids suitable for dissolving, dispersing, or suspending a functional material. Some examples of liquids can include ketones, esters, ethers, alcohols, aromatic hydrocarbons, and the like, and mixtures thereof. The liquid can be a flowable material, or, for example, a melted solid at or above 23° C. The rheology and the surface energy of the fluid composition are generally sufficient for disposing the fluid composition onto the structured surface region. The liquid has a boiling point such that liquid can be evaporated from the fluid composition.

In some embodiments, the liquid can be a mixture of one or more liquids present in the fluid composition. The liquid is generally capable of dissolving, suspending, or dispersing the functional material sufficiently for application of the fluid composition onto the structured surface region.

A functional material of the fluid composition can be a material suitable for chemical or physical modification of a structured substrate region. The functional material can comprise, but is not limited to, a metal, a metal precursor, an electroless plating catalyst, an electroless plating catalyst precursor, a mask material, a biological material, a natural oil, an aliphatic hydrocarbon, and the like or combinations thereof.

The concentration of the functional material in the fluid composition can be selected based on a number of factors. Some of these factors to consider include, but are not limited to, the surface tension of the fluid composition, the desired thickness of the functional material in the recessed features of the structured surface region, the dimensions of the topographical features on the structured surface region, and the surface energy of the structured surface region. The functional material can include a single material, or a plurality of materials.

The fluid composition can be disposed or applied onto the structured surface region of the substrate by different techniques. Suitable techniques include, for example, saturation or immersion techniques, spray coating, curtain coating, slide coating, flood coating, die coating, roll coating, deposition, or by other known coating or application methods. Techniques can be chosen which dispose the fluid composition uniformly or non-uniformly onto a portion of the structured surface region in an amount for selectively filling or partially filling the recessed features.

In some embodiments, the fluid composition being disposed onto the structured surface region fills the recessed features and floods the remainder (i.e. protrusive features) of the structured surface region. In other embodiments, the fluid composition is disposed onto the structured surface region filling a portion of the recessed features. In another embodiment, the fluid composition occupies a portion of the recessed features having recessed surfaces such that an air gap exists between at least a portion of the recessed surfaces and the fluid composition disposed within the recessed features. The topographical features (including the recessed features and protrusive features) of the structured surface region can have dissimilar dimensions capable of receiving all or receiving only a portion of the fluid composition. In some embodiments, a portion of the topographical features of the structured surface region can be void of the fluid composition.

The fluid composition can comprise at least 50 weight percent liquid, at least 60 weight percent liquid, or at least 70 weight percent liquid. In some embodiments, the fluid composition can comprise up to 99 weight percent liquid, up to 98 weight percent liquid, or up to 97 weight percent liquid. The liquid of the fluid composition can be in a range of 50 to 99 weight percent, 60 to 98 weight percent, or in a range of 70 to 97 weight percent.

Liquid is evaporated from a fluid composition disposed onto the structured surface region of the substrate. As the liquid is removed from the fluid composition, the volume of the fluid composition decreases and the functional material collects on the recessed surfaces of the recessed features. The functional material can collect on the recessed surface of the recessed features even if the functional material is still dispersed in another medium that contacts the recessed surface, an example of other mediums being polymer binders. As liquid is evaporated from the fluid composition, the functional material can collect on the recessed surfaces of the recessed features, and the remainder of the structured surface region can be left substantially free of the functional material. The term "evaporating liquid" refers to removing at least a portion of the liquid, or removing substantially all of the liquid from the fluid composition. The liquid evaporated from the fluid composition can be at least 40 weight percent, at least 45 weight percent, or at least 50 weight percent of the total weight of liquid in the fluid composition. In some embodiments, the liquid evaporated from the fluid composition can be up to 99 weight percent, up to 98 weight percent, or up to 97 weight percent. The liquid evaporated from the fluid composition can be in a range of 50 to 99 weight percent, in at range of 60 to 98 weight percent, or in a range of 70 to 97 weight percent based on the total weight of liquid in the fluid composition. The liquid of the fluid composition can be easily removed at lower temperatures under ambient conditions or it can be removed at elevated temperatures.

Figure 3:
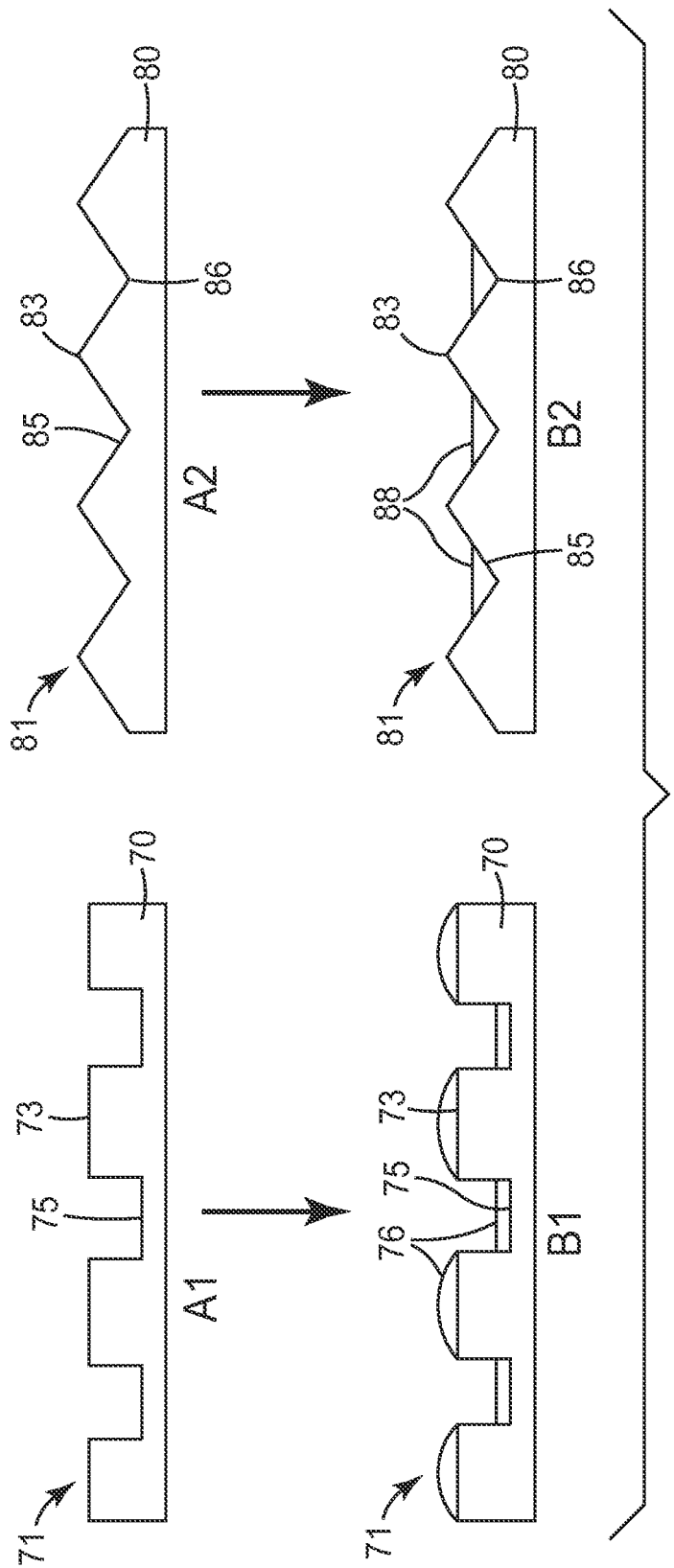
FIG. 3 A1-B1 is a schematic representation of a bilevel structured surface region including plateaus and a bilevel structured surface region including plateaus with an applied coating, respectively.

FIG. 3 A1 illustrates a substrate 70 having a structured surface region 71 comprising a plateau 73 and a recessed feature 75 before coating and plating. FIG. 3 B1 illustrates a substrate 70 after coating with a fluid composition comprising a liquid and a functional material, evaporating liquid, and then plating for forming a microstructure 76. Microstructure 76 is positioned on the plateau 73 and in the recessed feature 75 of the structured surface region. Optical micrograph FIG. 10 illustrates a cross-section of a bilevel substrate having functional material disposed on the plateaus and recesses of the substrate.

Figure 11:
FIG. 11 is an optical micrograph of a microstructure on a structured surface region in cross section of FIG. 12.
Figure 12:
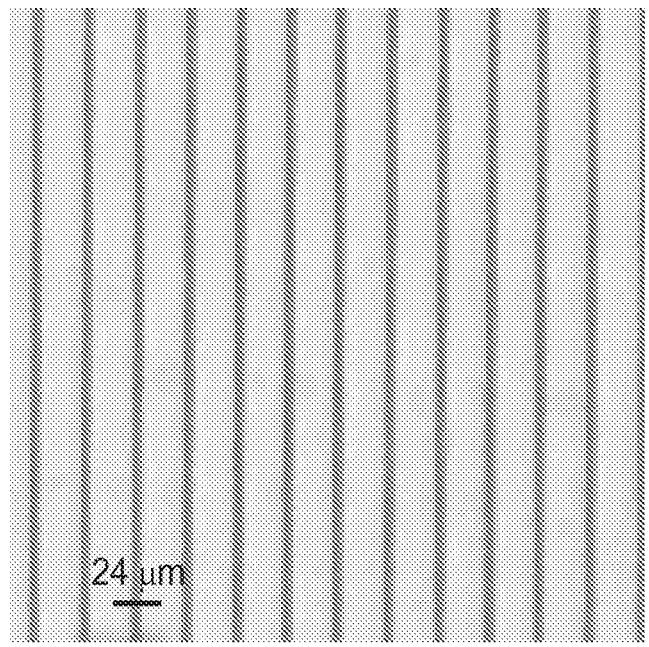
FIG. 12 is an optical micrograph of a microstructure on a structured surface region of FIG. 11.

FIG. 3 A2 illustrates a substrate 80 having a structured surface region 81 comprising a protrusive feature 83, and a recessed surface 85 of the recessed feature 86. FIG. 3B2 illustrates the substrate 80 after coating with a fluid composition comprising a liquid and a functional material, evaporating liquid, and then plating the functional material for forming a microstructure 88. Microstructure 88 is positioned in the recessed features 86 and on the recessed surface 85. The protrusive feature 83 after coating and plating is substantially free of microstructure 88. Optical micrograph FIG. 11 illustrates a cross-section of Example 1 (FIG. 12) having a functional material disposed in the recessed features of a brightness enhancement film.

Figure 10:
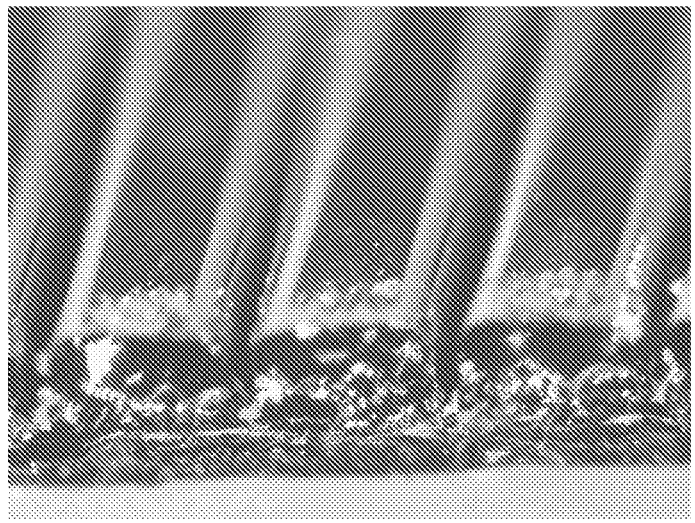
FIG. 10 is an optical micrograph of a microstructure on a structured surface region having a bilevel structure in cross-section.

FIG. 3 B1 and FIG. 10 illustrate functional material residing on the plateaus and within the recessed features of the structured surface region. In contrast, FIG. 3 B2 and FIG. 11 illustrate functional material residing within the recessed features of the structured surface region substantially free of plateaus as described in the present disclosure.

The liquid can be evaporated from the fluid composition by different techniques. Some suitable evaporation methods for removing liquids include, for example, convection, reduced pressure, heating, or other known methods.

In one embodiment of the method of the present disclosure, the functional material is a metal or metal precursor. The metal or metal precursor can be useful for forming conductive microstructures on a structured surface region of a substrate. Some suitable examples of metals include, for example, silver, nickel, platinum, gold, palladium, copper, indium, tin, aluminum, zinc, iron, tungsten, molybdenum, ruthenium, lead bismuth, and similar metals. Some suitable metals precursors useful include, for example, carboxylates, alkoxides or combinations of the metals described above. The metal precursors can be converted to a metal, metal oxide, or mixed metal oxide during processing eliminating ligands.

In one embodiment, the fluid composition comprises a conductive ink. The conductive ink can include a metal or metal precursor. Suitable conductive inks include liquid or liquid dispersions of metals, metal alloys or mixtures thereof. Some examples of metals and metal alloys useful for conductive inks include, for example, silver, tin, aluminum, copper, nickel, zinc and combinations thereof as similarly described in U.S. Patent Publication No. 2003/0108664 (Kodas et al.).

Conductive inks can include, for example, nanoparticles having an average particle size less than 500 nm, less than 400 nm, less than 250 nm, less than 100 nm, or less than 50 nm. The nanoparticles are generally preferred to be non-agglomerated. The nanoparticles can be optionally surface treated. Surface treatments can be used to prevent clumping and clustering of the nanoparticles, aiding in stability of the conductive ink and disposition onto a structured surface region.

In some embodiments, the conductive ink further comprises a polymeric material. In some embodiments, the polymeric material can include more than one or more polymers, copolymers or polymer blends. Suitable polymeric materials can be thermoplastic or thermoset polymers. The polymeric material can include, for example, conductive polymers, non-conductive polymers or combinations thereof. Suitable conductive polymers include, for example, poly(3,4-ethylenedioxy thiophene) (PEDOT), polyaniline (PAni), polypyrrole (PPy), polythiophene (PT), polydiacetylene, polyacetylene (PAc), polyisothianaphthene (PITN), polyheteroarylene-vinylene (PArV), wherein the heteroarylene group can for example be thiophene, furan or pyrrole, poly-p-phenylene (PpP), polyphenylene sulphide (PPS), polyperinaphthalene (PPN), polyphthalocyanine (PPc) and derivatives thereof, copolymers thereof and the like, and physical mixtures thereof. Suitable thermoplastic polymers include, for example, polyimides, polyolefins, acrylics, styrenes, and combinations thereof. Suitable thermoset polymers include, for example, polyamides, polyepoxides, phenolic polymers, polyimides, acrylic polymers, polyurethanes and silicone polymers. In some embodiments, mixtures of conductive polymers with thermoset and/or thermoplastic polymers can be used.

In some embodiments, a conductive ink comprises a liquid in an amount sufficient to disperse metallic nanoparticles, for example, and dissolve a polymer. Suitable liquids include, for example, water, organic liquids (e.g., mono-, di-, or tri-ethylene glycols or higher ethylene glycols, propylene glycol, 1,4-butanediol or ethers of such glycols, thiodiglycol, glycerol and ethers and esters thereof, polyglycerol, mono-, ti-, and tri-enanolamine, propanolamine, N,N-dimethylformamide, dimethyl sulfoxide, dimethylacetamide, N-methylpyrrolidone, 1,3-dimethylimidazolidone, methanol, ethanol, isopropanol, n-propanol, diacetone alcohol, acetone, methyl ethyl ketone, propylene carbonate), and the like, and combinations thereof. Other organic liquids can include, for example, esters, acetates, and the like, or combinations thereof. In some embodiments, the liquid is a ketone. In some embodiments, the liquid is an alcohol.

In some embodiments, the polymeric material is cured after evaporating the liquid from the fluid composition. The polymeric material can be "cured" by removing liquid, hardening, or by crosslinking the polymeric material. In some embodiments, the polymeric material can comprise a crosslinker or an additive to facilitate chain extension and/or crosslinking of the polymeric material.

In some embodiments, a structured surface region with a conductive ink disposed within the recessed features can be backfilled with an adhesive or refractive index matching material. "Backfilling" generally refers to filling of the recessed features with a material.

Backfilling can comprise filling the volume of the recessed features unoccupied by the functional material. In other embodiments, the backfilling comprises filling a portion of the recessed features, and in further embodiments, the backfilling comprises overfilling the recessed features and the protrusive regions (e.g., peaks) of the structured surface region. There can be several reasons to backfill the structured surface region after placement of functional material in the recessed features. In the case of a transparent substrate, it may be desirable to avoid the effects of refraction or reflection as light passes through the structured surface region of the substrate. This can be achieved by backfilling the structured surface region with material having the same or similar index of refraction (i.e., index-matched) as the substrate. Optionally, the backfilling material can be the same as the material of the substrate that defines the structured surface region. Alternatively, it may be useful to backfill the structured surface region in order to protect the functional material, for example from environmental degradation. Finally, it may be desirable to backfill the structured surface region in order to make the surface of a final article comprising the substrate with structured surface region smooth.

The adhesive or refractive index matching material useful for backfilling can be applied to the structured surface region comprising a conductive ink, a conductive ink having a polymeric material, or a conductive ink having a cured polymeric material. The adhesive or refractive index matching material generally has the same or substantially the same refractive index to that of the substrate so there is little or no reflection, or refraction of light passing through the substrate having a structured surface region. In some embodiments, the substrate having backfilled recessed features is transparent. Suitable materials such as adhesives or refractive index matching materials can include thermoplastic and thermosetting polymers that are transparent over the desired range of light wavelengths.

The difference between the refractive index of the substrate and the adhesive or refractive index matching material can be up to 0.2, up to 0.1, up to 0.05, or up to 0.01. The difference between the refractive index of the substrate and the adhesive or refractive index matching material preferably can be as low as 0.005, more preferably as low as 0.001, more preferably as low as 0.0005, and even more preferably as low as 0.0001. In some embodiments, the difference between the refractive index of the substrate and the refractive index of the adhesive or refractive index matching material can be in a range of 0.0001 to 0.2, 0.0005 to 0.1, 0.001 to 0.05, or in a range of 0.005 to 0.01.

These backfilling materials can be amorphous, crystalline, or semi-crystalline, and can include, for example, homopolymer, copolymer or blends thereof. Suitable materials include, but are not limited to, poly(carbonate) (PC); syndiotactic (not used in optically isotropic form) and isotactic poly(styrene) (PS); C1-C8 alkyl styrenes; alkyl, aromatic, and aliphatic ring-containing (meth)acrylates, including poly(methylmethacrylate) (PMMA) and PMMA copolymers; ethoxylated and propoxylated (meth)acrylates; multifunctional (meth)acrylates; acrylated epoxies; epoxies; and other ethylenically unsaturated materials; cyclic olefins and cyclic olefinic copolymers; acrylonitrile butadiene styrene (ABS); styrene acrylonitrile copolymers (SAN); epoxies; poly(vinylcyclohexane); PMMA/poly(vinylfluoride) blends; poly(phenylene oxide) alloys; styrenic block copolymers; polyimide; polysulfone; poly(vinyl chloride); poly(dimethyl siloxane) (PDMS); polyurethanes; saturated polyesters; poly(ethylene), including low birefringence polyethylene; poly(propylene) (PP); poly(alkane terephthalates), such as poly(ethylene terephthalate) (PET); poly(alkane napthalates), such as poly(ethylene naphthalate)(PEN); polyamide; ionomers; vinyl acetate/polyethylene copolymers; cellulose acetate; cellulose acetate butyrate; fluoropolymers; poly(styrene)-poly(ethylene) copolymers; PET and PEN copolymers, including polyolefinic PET and PEN; and poly(carbonate)/aliphatic PET blends. The term (meth)acrylate is defined as being either the corresponding methacrylate or acrylate compounds.

Figure 4A:
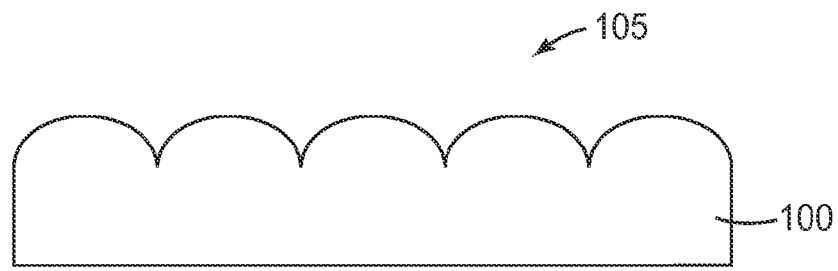
FIG. 4 A-D is a schematic representation of the process of forming a microstructure on a structured surface region.
Figure 4B:
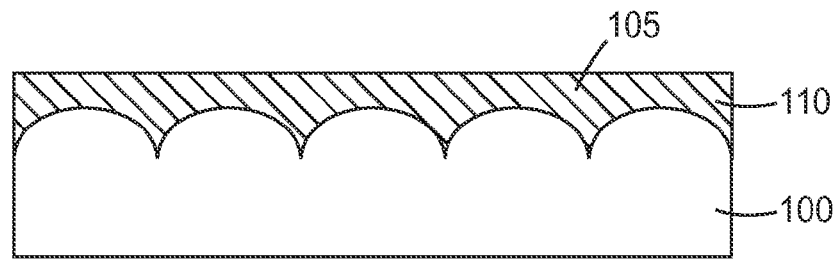
Figure 4C:
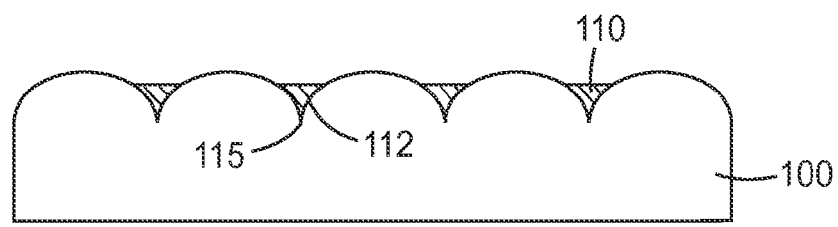
Figure 4D:
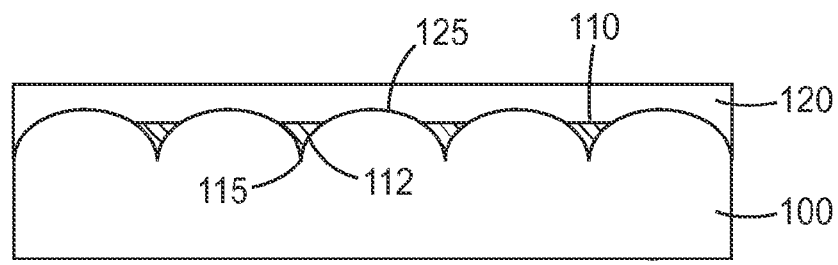

FIG. 4A illustrates a substrate 100 having a structured surface region 105. FIG. 4B illustrates substrate 100 having a fluid composition 110 comprising a liquid and a metal or a metal precursor disposed on the structured surface region 105. FIG. 4C illustrates a substrate having the metal or metal precursor of the fluid composition 110 after evaporating liquid such that the metal or the metal precursor of the fluid composition 110 collects on the recessed surfaces 112 of the recessed features 115. FIG. 4D illustrates backfilling the substrate 100 with an adhesive or refractive index matching material 120 encapsulating the metal or the metal precursor of the fluid composition 110 or a metal derived from a metal precursor of the fluid composition 110 providing an interface 125 of the adhesive or refractive index matching material 120 and the metal or metal precursor of fluid composition 110 or a metal derived from a metal precursor of fluid composition 110.

In some embodiments, conductive inks, conductive inks comprising a polymeric material, or conductive inks comprising a cured polymeric material collected within the recessed features are electrolessly plated. Electroless plating is described below within the present disclosure.

In some embodiments, conductive inks, conductive inks comprising a polymeric material, or conductive inks comprising a cured polymeric material collected within the recessed features are electrolytically plated. Electrolytic plating is described in Mohler, J. B., *Electroplating and Related Processes*, Chemical Publishing Company, New York (1969); U.S. Pat. No. 5,137,611 (Roberts et al.); and U.S. Pat. No. 6,632,343 (Farnsworth et al.).

In some embodiments, structured surface regions electrolessly plated conductive inks, electrolessly plated conductive inks having a polymeric material, or electrolessly plated conductive inks having a cured polymeric material can be backfilled with an adhesive or refractive index matching material as described above.

In some embodiments of the methods of the present disclosure, the functional material is an electroless plating catalyst. In other embodiments, the functional material is an electroless plating catalyst precursor. Some suitable electroless plating catalysts include, for example, palladium, platinum, rhodium, silver, gold, copper, nickel, cobalt, iron, and tin, as well as alloys and compounds of the elements with each other or with other elements. In some embodiments, the electroless plating catalyst comprises silver, platinum, and the like or combinations thereof.

In some embodiments, the functional material is an electroless plating catalyst precursor. Suitable electroless plating catalyst precursors include, for example, alkoxides, carboxylates, and halides of palladium, platinum, rhodium, silver, gold, copper, nickel, cobalt, iron, and tin, as well as alloys and compounds of the elements with each other or with other elements. In some embodiments, the electroless plating catalyst precursor comprises palladium acetate. In some embodiments, the electroless plating catalyst precursor comprises metal organic palladium compounds including palladium diketonates such as palladium 2,4-pentanedionate. An electroless plating catalyst precursor can be converted to an electroless plating catalyst by a conversion step as described below.

The fluid composition comprising an electroless plating catalyst can be disposed onto the structured surface region. As described above, the liquid is evaporated from the fluid composition, and the functional material collects on recessed surfaces of the recessed features. The electroless plating catalyst collected on the recessed surfaces of the recessed features can be electrolessly plated with a conductive material.

In some embodiments, the electroless plating catalyst collected on the recessed surfaces of the recessed features is electrolessly plated with, for example, an electroless plating bath. The electroless plating or deposition refers to a process for the autocatalytic plating of conductive materials such as metals. This process typically involves the use of an electroless plating solution that contains a soluble form of the deposit metal together with a reducing agent. The soluble form of the deposit metal is usually an ionic species or a metal complex (i.e., a metal species coordinated to one or more ligands). Electroless deposition does not require the application of electrical current to a work piece that is being coated. The process of electroless plating is described by Mallory and J. B. Hajdu in *Electroless Plating—Fundamentals and Applications*, ed. G. O. Norwich (1990).

Some of the steps involved in electroless plating include preparing the structured surface region with a catalytic surface (i.e., electroless plating catalyst), and immersing the substrate having the structured surface region into an appropriate plating bath. The catalytic surface of the electroless plating catalyst catalyzes the deposition of metal from the electroless plating solution. Once started, plating proceeds by the continued reduction of the solution metal source catalyzed by its own metal surface, hence the term "autocatalytic." Metal deposits that can be formed using electroless plating include, for example, copper, nickel, gold, silver, palladium, rhodium, ruthenium, tin, cobalt, zinc, as well as alloys of these metals with each other or with phosphorous or boron, as well as compounds of these metals with each other or with phosphorous or boron. Suitable reducing agents include, for example, formaldehyde, hydrazine, aminoboranes, and hypophosphite. The electroless plated metal and the metal of the electroless plating catalyst collected on the structured surface region of the substrate can be the same or different. Electroless plating is further described in U.S. Pat. No. 7,160,583 (Frey et al.).

In some embodiments, the fluid composition comprises an electroless plating catalyst precursor. The electroless plating catalyst precursor is heated after evaporating liquid from the fluid composition for forming an electroless plating catalyst. Techniques useful for heating the electroless plating catalyst precursor include, for example, convection, radiation, and combinations thereof. In some embodiments, the electroless plating catalyst precursor can undergo photolytic decomposition to form an electroless plating catalyst. In some embodiments, the resulting electroless plating catalyst can be electrolessly plated as described above to form electrolessly plated structured surface regions.

In some embodiments, the electrolessly plated structured surface regions can be backfilled with an adhesive or a refractive index matching material as described above.

In some embodiments, the fluid composition comprises a polymeric material. Polymeric materials suitable for fluid compositions having electroless plating catalysts include, for example, thermoplastic polymers such as polyimides, polyolefins, acrylics, styrenes, and the like, or combinations thereof. Some suitable thermoset polymers include, for example, polyamides, polyepoxides, phenolic polymers, polyimides, acrylic polymers, polyurethanes, silicone polymers, and the like, or combinations thereof.

The polymeric material present in a fluid composition having an electroless plating catalyst can be cured. The polymeric material can be cured by removing liquid, hardening, or by crosslinking the polymeric material. In some embodiments, the polymeric material can comprise a crosslinker or an additive to facilitate chain extension and/or crosslinking of the polymeric material. The electroless plating catalyst in combination with a cured polymeric material of the fluid composition can be electrolessly plated as described above.

Figure 5A:
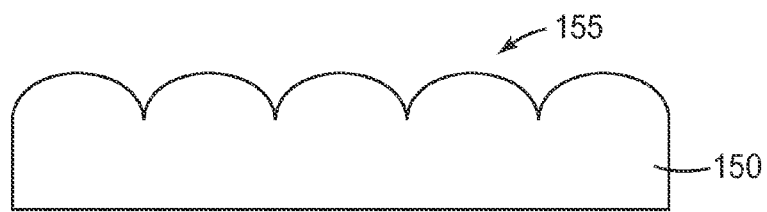
FIG. 5A-E is a schematic representation of the process of forming a microstructure on a structured surface region.
Figure 5B:
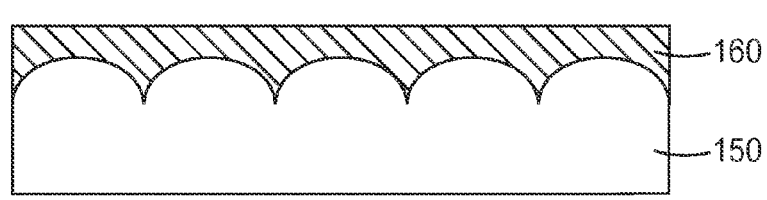
Figure 5C:
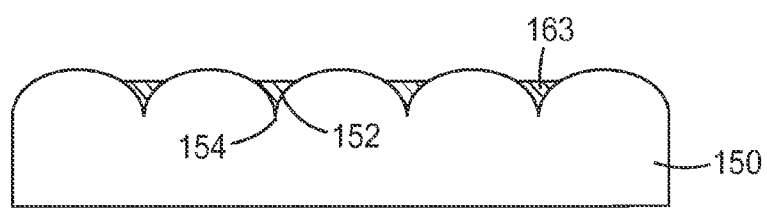
Figure 5D:
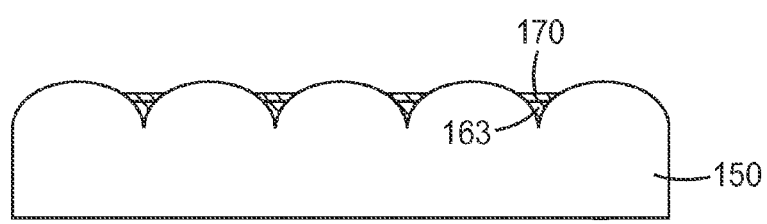
Figure 5E:
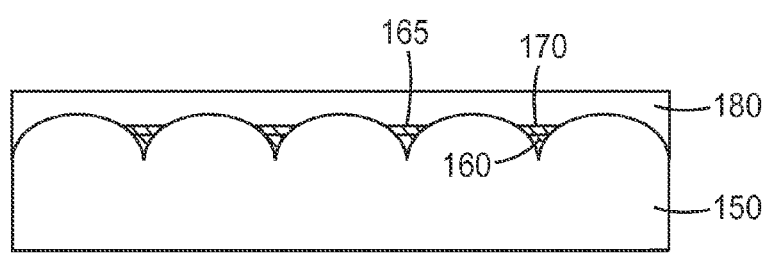

FIG. 5A illustrates a substrate 150 having a structured surface region 155. FIG. 5B illustrates substrate 150 having a fluid composition 160 comprising a liquid and an electroless plating catalyst or an electroless plating catalyst precursor disposed on the structured surface region 155. FIG. 5C illustrates a substrate 150 retaining the electroless plating catalyst or electroless plating catalyst precursor 163 after evaporating liquid from the fluid composition 160 such that the electroless plating catalyst or the electroless plating catalyst precursor 163 collects on the recessed surfaces 152 of the recessed features 154. FIG. 5D illustrates a metal 170 plated on the electroless plating catalyst 163. FIG. 5E illustrates an adhesive or refractive index matching material 180 encapsulating the metal 170 and the electroless plating catalyst 163 providing an interface 165 between the metal 170 and the adhesive or refractive index matching material 180.

In some embodiments of the methods of the present disclosure, the functional material is a mask material. The mask material refers to a material applied to a substrate providing protection of a substrate during processing, and which can be removed subsequently to expose the substrate. The mask material can be useful for masking metal layers or metal containing microstructures on structured surface regions of substrates. The mask material comprises, for example, a polymeric material, an inorganic material, a particle filled composite, or combinations thereof. Some suitable polymeric materials include, for example, polyacrylates, poly(meth) acrylates, polyesters, polycarbonates, polyimides, and the like, or combinations thereof. The polymeric material can provide protection or isolation of the structured surface region prior to a chemical or physical modification of the surface of the structured surface region. The polymeric material can include, for example, one or more polymers, copolymers, or polymer blends. The particle filled composite can comprise microparticles, nanoparticles, or combinations thereof, combined with a cellulosic material, a polymeric binder, and the like. The particles can be particle oxides, surface modified particles, and the like or combinations thereof.

In one embodiment, the mask material is a polymeric material. The polymeric mask material (e.g., polymeric material) present in the fluid composition can be cured after evaporating the liquid from the fluid composition. In some embodiments, the mask material is a particle filled composite.

In some embodiments, a metal layer can be deposited on the mask material collected on the recessed surfaces of the recessed features and on the remainder of the structured surface region which is substantially free of the mask material. The metal layer can be deposited by physical or chemical vapor deposition techniques including, for example, sputtering or evaporation methods.

In some embodiments, the metal layer deposited on the mask material located on the recessed surfaces of the recessed features can be removed. In the method described herein, the mask may be regarded as a lift-off mask. The metal layer can remain on the remainder (e.g., protrusive regions) of the structured surface region (i.e., the regions without the mask material). The mask material and the metal layer deposited on the mask material can be removed from the structured surface region by dissolving, heating, degrading or combinations thereof.

In some embodiments, the structured surface region having a metal layer residing on the remainder of the structured surface region can be can be backfilled with an adhesive or refractive index matching material.

Figure 6A:
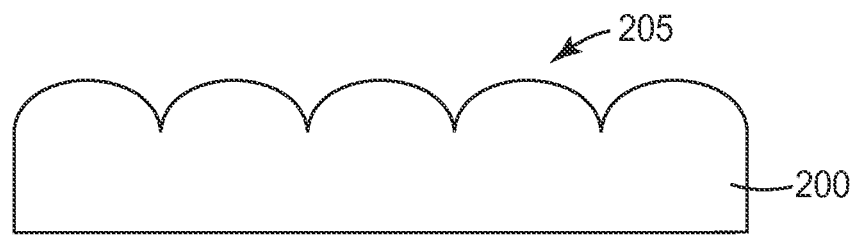
FIG. 6A-F is a schematic representation of the process of forming a microstructure on a structured surface region.
Figure 6B:
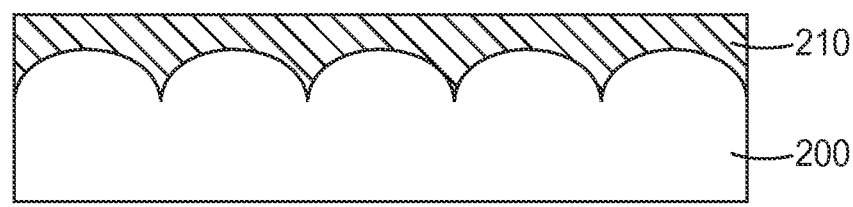
Figure 6C:
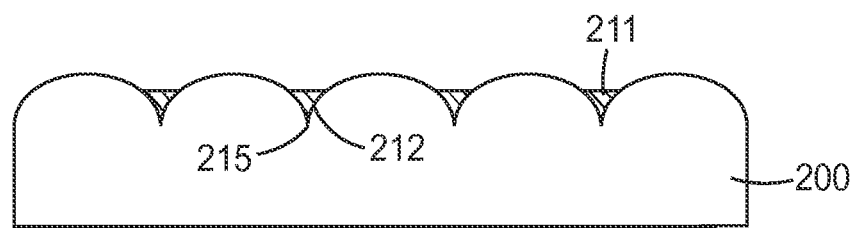
Figure 6D:
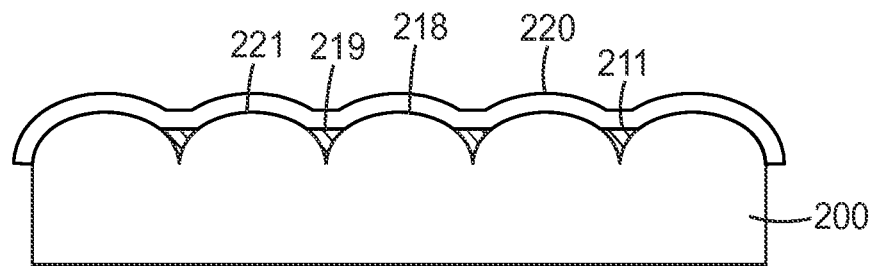
Figure 6E:
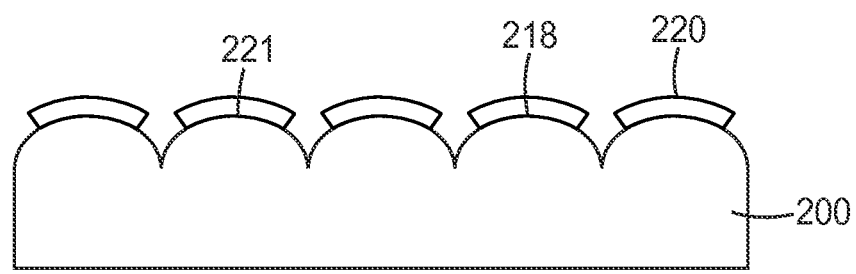
Figure 6F:
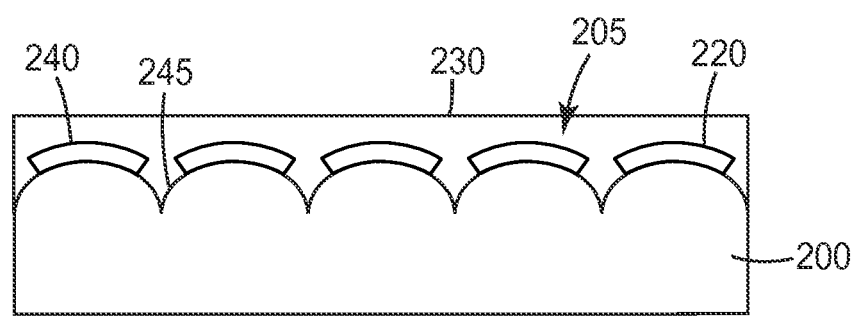

FIG. 6A illustrates a substrate 200 having a structured surface region 205. FIG. 6B illustrates the substrate 200 having a fluid composition 210 comprising a mask material and a liquid disposed on the structured surface region 205. FIG. 6C illustrates a substrate 200 retaining the fluid composition 210 after evaporating liquid such that the mask material 211 collects on the recessed surfaces 212 of the recessed features 215. FIG. 6D illustrates a metal 220 evaporated or sputtered on i) the mask material 211 having a first interface 219, and ii) the protrusive features 218 of the structured surface region 205 having a second interface 221. FIG. 6E illustrates substrate 200 having the mask material 211 and the metal 220 deposited on the mask material 211 removed and metal 220 resides on the protrusive features 218 at the second interface 221 of the structured surface region 205. FIG. 6F illustrates an adhesive or refractive index matching material 230 encapsulating the metal 220 and the structured surface region 205 of the substrate 200 having a third interface 245 between the recessed surface 212 of the recessed features 215 and the adhesive or refractive index matching material 230. A fourth interface 240 resides between the metal 220 and the adhesive or refractive index matching material 230.

In another aspect, a method of forming a microstructure is provided. The method includes providing a substrate comprising a metallized structured surface region comprising a metal layer disposed on a surface of the structured surface region. The metallized structured surface region comprises one or more recessed features having recessed surfaces. The metallized structured surface region is substantially free of plateaus. The method includes disposing a fluid composition comprising a resist material and a liquid onto the metallized structured surface region, evaporating liquid from the fluid composition and collecting the resist material on the recessed surfaces of the recessed features such that the remainder of the metallized structured surface region is substantially free of the resist material.

By metallized, what is meant is that the structured surface region includes a metal-containing material layer. Herein, the term metal-containing material layer is used interchangeably with the term metal layer. Some examples of the metal-containing materials for the metallized structured surface region include elemental metal, metal alloys, metal mixtures, intermetallic compounds, metal oxides, metal sulfides, metal carbides, metal nitrides, and combinations thereof. Exemplary metals include, for example, gold, silver, palladium, platinum, rhodium, copper, nickel, iron, indium, tin, tantalum, titanium, chromium, tungsten.

Resist materials of the fluid composition can collect on the recessed surfaces, which are metallized surfaces, of one or more of the recessed features. As used herein, "resist material" refers to a material used as a coating of a metal-containing layer that protects the metal-containing layer from chemical and/or physical action (e.g., metal etching of a subtractive process). Suitable examples of resist materials include a polymeric material, an inorganic material, and the like, or combinations thereof. Resist materials are described in U.S. Pat. No. 6,077,560 (Moshrefzadeh et al.).

Some examples of commercial resist materials include photoresists such as a resist under the trade designation SHIPLEY RESIST 1400-37 from Shipley Company of Marlborough, Mass.; resist under the trade designation RONASCREEN 2400 from LeaRonal of Freeport, N.Y.; and another photoresist under the trade designation DANOCURE 1173 (isobornyl acrylate with photoinitiator) from UCB Chemicals Corporation of Smyrna, Ga.

Some examples of inorganic resist materials include, for example, metal oxides and metal nitrides, inorganic semiconductors, metals, and the like. Representative examples of useful metal oxides and metal nitrides include, for example, silicon oxides, aluminum oxides, tantalum oxides, titanium oxides, silicon nitrides, barium titanate, barium strontium titanate, barium zirconate titanate, and the like.

In some embodiments, the resist material can be cured after evaporating the liquid from the fluid composition. Monomeric precursors (reactive monomers) that can be deposited and subsequently cured (e.g., UV or e-beam curing) can also be used. In addition, small molecules such as, for example, organic glasses, crystalline organics, and the like can be used.

A subtractive process can be used to remove the exposed metal-containing material layer of the metallized structured surface region. Some useful subtractive processes for removing the exposed metal-containing layer of the metallized structured surface region include, for example, wet chemical etching, the use of liquid materials, dry etching (e.g., plasma/reactive ion etching), and laser ablation. Wet chemical etching typically involves the removal of material by immersing the metallized substrate in a liquid bath of a chemical etchant or by spraying the metallized structured surface region with a chemical etchant that reacts with the metal-containing material layer on the metallized structured surface region. Representative examples of etchants include, for example, HF, HF:NH$_4$F, KOH, ethylenediamine pyrocatechol (EDP), CsOH, NaOH, and hydrazine (N$_2$H$_4$—H$_2$O) for silicon; HCl:glycerin, iodine, KI:I2-H$_2$O, and HNO$_3$ for metals; and HF and HCl for metal oxides or nitrides. Liquid removal of metal-containing material layers typically involves exposing the metallized structured surface region to a liquid in which the layer is soluble. Useful liquids include, for example, aqueous and organic solutions such as solutions based on water, acetone, toluene, hexane, heptane, cyclohexane, and the like, and mixtures thereof. Dry etching is performed either by plasma or reactive ions. Dry etching generally involves exposing the metal-containing material layer of the metallized structured surface region to be removed to a reactive plasma, which etches the metal-containing material layer through a combination of physical and chemical processes. Plasma can be generated in an etchant gas using techniques such as, for example, radio frequency energy, microwave energy, or microwave energy combined with magnetic confinement. Useful etchant gases include, for example, chlorohydrocarbons (for example, CFCl$_3$, CF$_2$Cl$_2$, and CF$_3$Cl), halocarbons (for example, CCl$_4$, CF$_4$, CHCl$_3$, and CHF$_3$), fluorine-based gases (for example, SF$_6$, NF$_3$, and SiF$_4$), chlorine-based gases (e.g., Cl$_2$, BCl$_3$, and SiCl$_4$), and bromine-based gases (for example, Br$_2$ and HBr). Laser ablation involves the direct removal of the metal layer by exposing portions of the metal to laser light of an intensity and wavelength sufficient to decompose the metal. Typically, an ultraviolet (UV) laser is used; however, the illumination can be any kind of light, such as infrared or visible light. Any type of suitable laser such as, for example, CO$_2$ lasers or excimer lasers can be used. Excimer lasers are particularly useful. Any type of excimer laser (for example, F$_2$, ArF, KrCl, XeCl, or KrF) can be used. The subtractive process selected can depend upon the metallized structured surface region and the resist material utilized. The selected subtractive process can depend on the degree of selectivity of a particular subtractive process between the removal of the metal layer and the removal of the resist material (that is, the removal process should selectively remove the metal layer of the metallized structured surface region rather than the resist material) is described in WO 2005061752 (Theiss). Appropriate subtractive processes will be apparent to one skilled in the art.

In some embodiments, the resist material can be cured after evaporating the liquid from the fluid composition. Curing of the resist material can occur by removing liquid, drying the resist material, or by crosslinking.

In some embodiments, the recessed features or at least a portion of the recessed features of the metallized structured surface region comprises a resist material, or a resist material and a polymeric material, or a resist material and a cured polymeric material collected on the recessed surfaces of the recessed features. The remainder of the metallized structured surface region is substantially free of the resist material. The metal layer of the remainder of the metallized structured surface region can be etched by having at least a portion of the metal layer removed from the metallized structured surface region. Materials for removing or etching the remainder of the metal layer of the metallized structured surface region have been described. The resist material on the recessed surfaces of the recessed features protects the metal layer disposed beneath the resist material during etching procedures.

In some embodiments, the fluid composition comprises a resist material and a polymeric material, or the fluid composition comprises a resist material and a cured polymeric material that can be removed from the recessed surfaces of the recessed features of the metallized structured surface region after etching the metal layer from the remainder of the metallized structured surface region. Upon removal of the resist material of the recessed features, the metal layer of the metallized structured surface region can be exposed within the recessed features. The resist material can be removed by heating, dissolving, degradation or other methods known to those of skill in the art.

In some embodiments, the structured surface region having a metal-containing material layer and the resist material remaining in the recessed features after etching, can be backfilled with an adhesive or refractive index matching material. In other embodiments, the structured surface region having a metal-containing material layer remaining in the recessed features and the resist material removed can be backfilled with an adhesive or refractive index matching material.

Figure 7A:
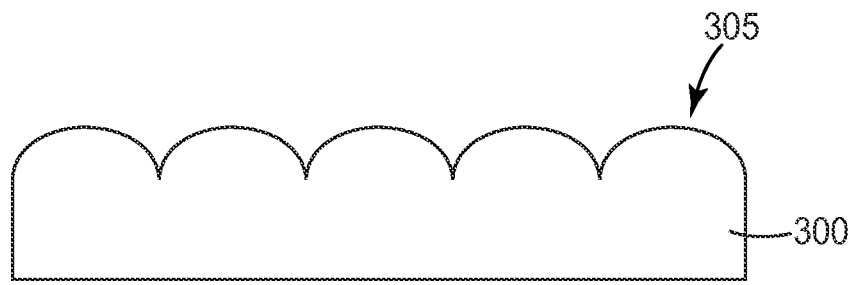
FIG. 7A-G is a schematic representation of the process of forming a microstructure on a structured surface region.
Figure 7B:
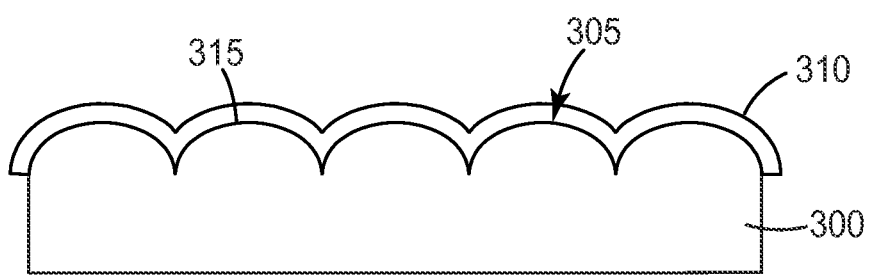
Figure 7C:
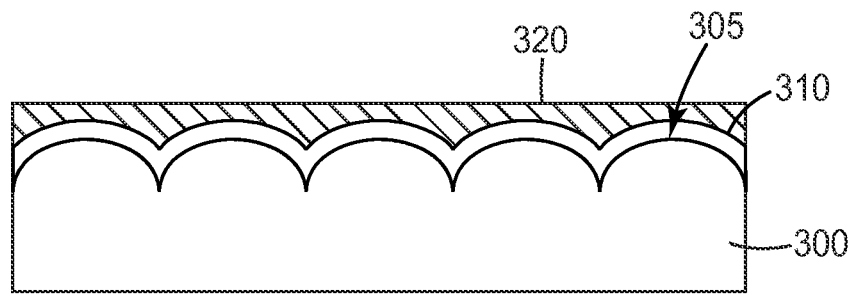
Figure 7D:
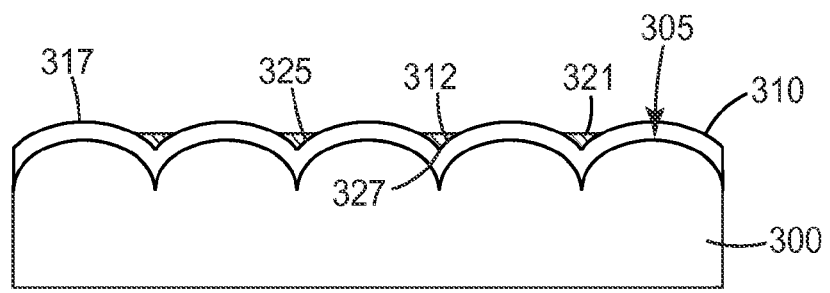
Figure 7E:
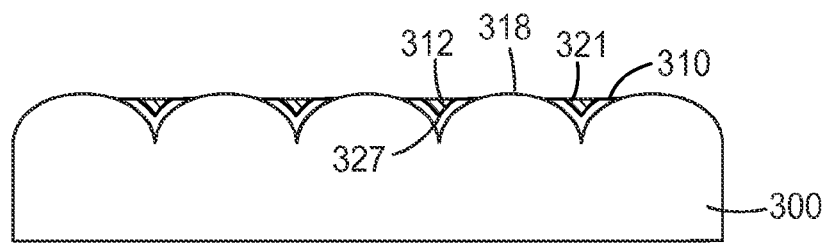
Figure 7F:
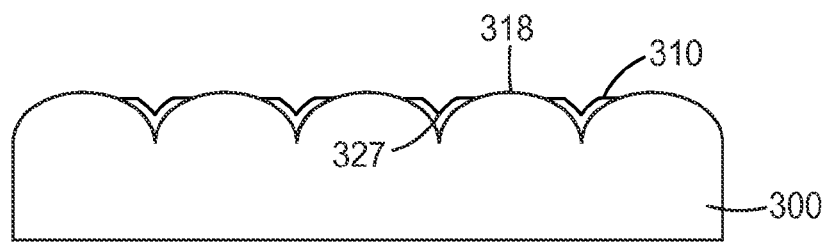
Figure 7G:
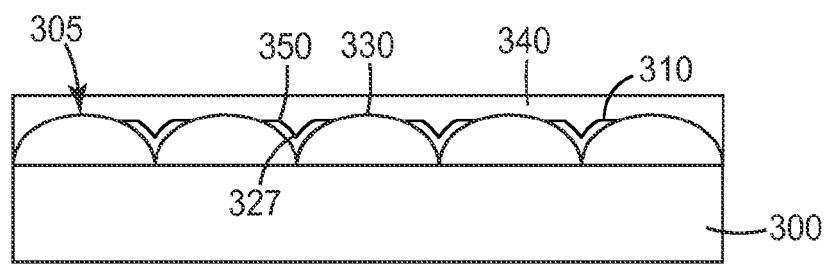

FIG. 7A illustrates a substrate 300 having a structured surface region 305. FIG. 7B illustrates the substrate 300 having a metal layer 310 deposited on the structured surface region 305 having at a metal-substrate interface 315. FIG. 7C illustrates a fluid composition 320 comprising a resist material and a liquid disposed on the metal layer 310. FIG. 7D illustrates a substrate 300 having a metal layer 310 deposited on the structured surface region 305 such that the resist material 321 upon evaporation of liquid from the fluid composition 320 collects on the metallized recessed surfaces 312 of the metallized recessed features 327 having an interface 325 between resist material 321 and the metal layer 310. FIG. 7E illustrates selectively etching the metal layer 310 from the protrusive regions 318 leaving the resist material of the fluid composition 320 and the metallized recessed surfaces 312 of the metallized recessed features 327. FIG. 7F illustrates substrate 300 having the metal layer 310 of the metallized recessed features 327 remaining after removal of the resist material 321. FIG. 7G illustrates an adhesive or refractive index matching material 340 encapsulating the metal layer 310 of the metallized recessed features 327 and the structured surface region 305 of the substrate 300. A metal-adhesive or refractive index matching material interface 350 and a substrate-adhesive or refractive index matching material interface 330 are formed.

In some embodiments, articles are provided. The articles comprise a transparent substrate with a structured surface region, a functional material that is electrically conductive (an electrically conductive material) selectively placed in the recessed features of the structured surface region, and a leveling layer of adhesive or refractive index matching material backfilled into the recessed features of the structured surface region. The structured substrate region is substantially free of plateaus. By selectively placed in the recessed features of the structured surface region, what is meant is that the electrically conductive material exists in recessed features and in contact with recessed surfaces and does not exist on at least a portion of the remainder of the structured surface region, for example the surface of protrusive features.

The electrically conductive material may include any one or more of the conductive materials left in contact with the recessed surfaces according to the aforementioned methods of the disclosure. The substrate material of the article may be selected from any of the aforementioned substrate materials that are transparent and that are useful for the methods described above. Particularly useful substrate materials include molded polymer substrates, for example substrate materials fabricated with a structured surface region by molding a polymer film against a physical tool by, for example, thermal embossing or curing.

The backfilling material, for example, the adhesive or refractive index matching material, may be selected from those listed earlier in the present disclosure as useful in the aforementioned methods. By leveling, what is meant about the layer of adhesive or index matching material is that it i) completely fills any volume of the recessed features of the structured surface region that is not occupied by the electrically conductive material, ii) optionally covers protrusive features of the structured surface region, and iii) has a surface opposite its interface with the surface of the structured surface region that is parallel with the major surface contour of the substrate. In some embodiments, the difference between the index of refraction of the backfilling material and the index of refraction of the substrate is less than or equal to 0.2.

The geometry of the topography of the structured surface region of the substrate of the article may be selected according to the earlier descriptions of substrates useful for the methods above. Preferred substrates for the article may be selected according to the preferences described above for substrates that are useful for the aforementioned methods, in terms of the sizes and shapes of topographical features, the uniformity of topographical features, and the uniformity of the density of topographical features.

In addition to preferences for the topographical features of the substrate, preferred articles may be defined in terms of a pattern of the electrically conductive material in contact of the recessed surfaces. The pattern of electrically conductive material, which is at least in part registered with the pattern of recessed features, can include repeating geometric features, for example periodically spaced lines. The electrically conductive material can take the form of a two-dimensional network, grid, or mesh. The two-dimensional network, grid, or mesh can comprise a regular, periodic geometry or can comprise a random geometry. The electrically conductive material can take the form of a series of parallel lines. For some embodiments wherein the electrically conductive material takes the form of a two-dimensional network, grid, or mesh, or a series of parallel lines, the width of the lines defining these patterns is preferably uniform and preferably within the range of 10 nanometers and 500 micrometers, more preferably within the range of 50 nanometers and 100 micrometers, more preferably within the range of 100 nanometers and 25 micrometers, more preferably within the range of 250 nanometers and 10 micrometers, more preferably within the range of 500 nanometers and 5 micrometers, and most preferably within the range of 1 micrometer and 4 micrometers. For some embodiments wherein the electrically conductive material takes the form of a two-dimensional network of lines, grid, or mesh, or a series of parallel lines, the area percentage of the structured surface region that is occupied or covered by electrically conductive material is preferably between 0.01 and 50 percent, more preferably between 0.1 and 25 percent, more preferably between 1 and 15 percent.

Figure 8:
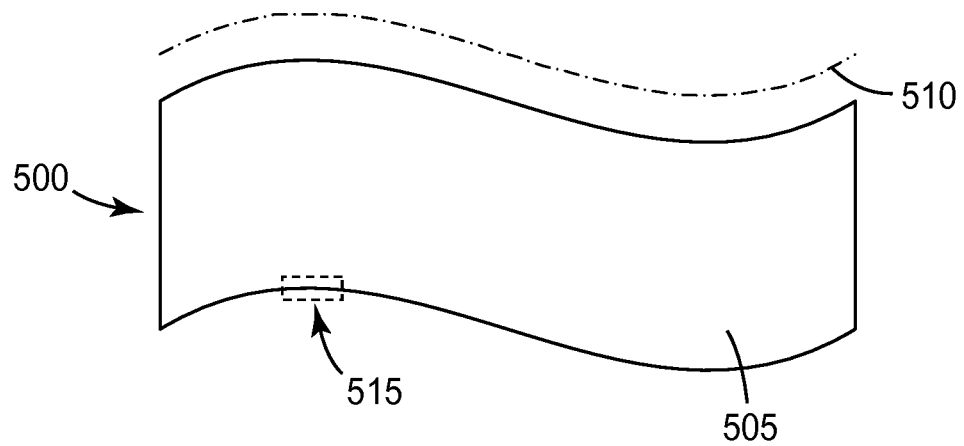
FIG. 8 is a schematic representation of an article (e.g., flexible sheet) comprising a structured surface region.

FIG. 8 illustrates an article 500 according to one embodiment, including a structured surface region 515 shown in cross section. The article 500 is in the form of a flexible sheet with major surface 505 having major surface contour 510.

Figure 9:
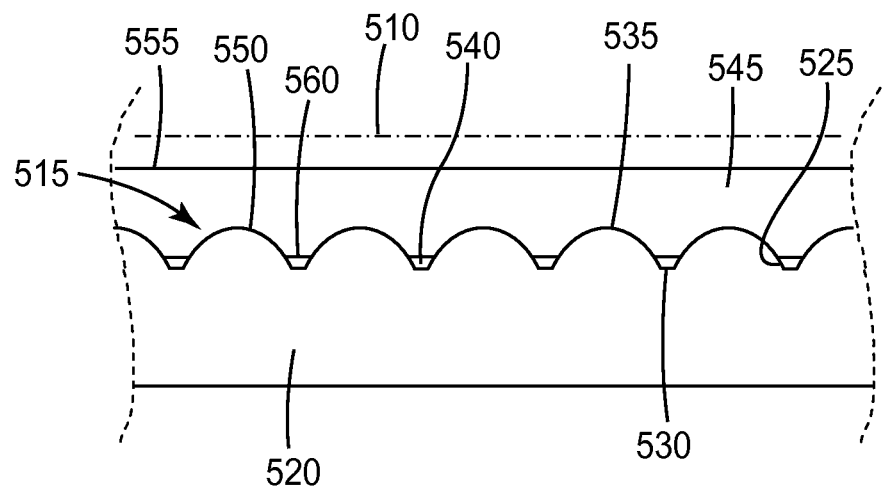
FIG. 9 is a schematic representation of an article comprising a microstructure and a backfilling material.

FIG. 9 illustrates article 500 comprising a substrate 520 with a structured surface region 515 having a major surface contour 510. The structured surface region 515 includes recessed features 530 and protrusive features 535. The recessed features 530 having recessed surfaces 525 include electrically conductive material 540 in contact with recessed surfaces 530 and recessed surfaces 525. The structured surface region is in contact with backfilling material 545 at substrate-backfilling material interface 550 and conductive material-backfilling material interface 560. The back filling material also includes a first surface 555 that is parallel with the major surface contour 510.

The microstructures of the current disclosure can be utilized in many applications. In some embodiments, the microstructures include conductive features having sufficiently small minimum dimensions (e.g., width of a line) that are invisible, or nearly invisible to the naked eye. Some applications using the microstructures include electronic circuitry, for example, flexible circuitry. Other applications using the microstructures include devices requiring electrodes. Examples of electrodes include essentially planar electrodes, flexible electrodes, and the like that are electrically conductive and light transmitting over large areas (e.g., large areas greater than 1 $cm^2$, greater than 500 $cm^2$, or greater than 1 $m^2$). Some examples of devices that include electrodes include electrochromic window and displays, electroluminescent lamps, resistively heated windows, and touch screen displays. Other applications include microstructures include use in shielding electromagnetic radiation, for example, electromagnetic interference (EMI). Examples of the latter include electronic information displays, for example, plasma display panels (PDP).

The disclosure will be further clarified by the following examples which are exemplary and not intended to limit the scope of the disclosure.

EXAMPLES

The present disclosure is more particularly described in the following examples that are intended as illustrations only, since numerous modifications and variations within the scope of the present disclosure will be apparent to those skilled in the art. Unless otherwise noted, all parts, percentages, and ratios reported in the following examples are on a weight basis, and all reagents used in the examples were obtained, or are available, from the chemical suppliers described below, or can be synthesized by conventional techniques.

Example 1

A pre-plating solution was prepared. Palladium acetate ($Pd(OAc)_2$); 0.24 grams; Alfa Aesar, Ward Hill, Mass.) and cellulose acetate (1.36 grams; Sigma Aldrich, St. Louis, Mo.) were dissolved in acetone (98.4 grams; Sigma Aldrich, St. Louis, Mo.) to form the pre-plating solution. The pre-plating solution was deposited with a pipette onto a prismatic film available under the trade designation VIKUITI 90/24 BRIGHTNESS ENHANCEMENT FILM II (3M Company, Display and Graphics Division, Maplewood, Minn.). The pre-plating solution was subsequently drawn down with a wire-wound Meyer Rod (4 mil (100 micrometers); R.D. Specialties, Incorporated, Webster, N.Y.) to provide a coating. The coating on the substrate was left undisturbed until the acetone was evaporated from the coating such that the substrate was dry to the touch forming a sample. The sample was dried for about 30 seconds at room temperature and atmospheric pressure. After the sample was dried, it was placed into a copper containing electroless plating bath (M85-System; MacDermid Incorporated, Waterbury, Conn.) for about four minutes. The sample was removed from the electroless plating bath, washed with deionized water (Sigma Aldrich, St. Louis, Mo.), and dried in air under room temperature and atmospheric pressure After drying, the sample having a microstructure was backfilled with a UV (ultraviolet)-curable acrylate resin available under the trade designation 3M EAGLE Resin (3M Company, St. Paul, Minn.). The microstructure of the prismatic film was backfilled by laminating the UV-curable acrylate resin between a sheet of polyethylene terephthalate ((PET); Eastman Chemical Company, Kingsport, Tenn.) and the prismatic film to form a laminated structure. The laminated structure was placed into a Fusion UV curing chamber (Model MC-6RQN; Fusion UV Systems, Gaithersburg, Md.). The UV curable resin acrylate was polymerized with UV radiation (H-bulb).

The PET sheet was removed from the laminated structure. The copper microstructure (e.g., copper traces) within the recessed features of the prismatic film were measured with a light microscope (Leica Reichert Polyvar 2; Leica, Allendale, N.J.). The width or cross-section of the copper microstructures was disposed in the recessed features was about 4-8 micrometers as illustrated in optical micrograph FIG. 11. The electrical sheet resistance of a 2.54 cm wide array of copper microstructures was measured in a range of about 0.25 to about 2.5 ohms/square as illustrated in an optical micrograph FIG. 12.

Example 2

Figure 13:
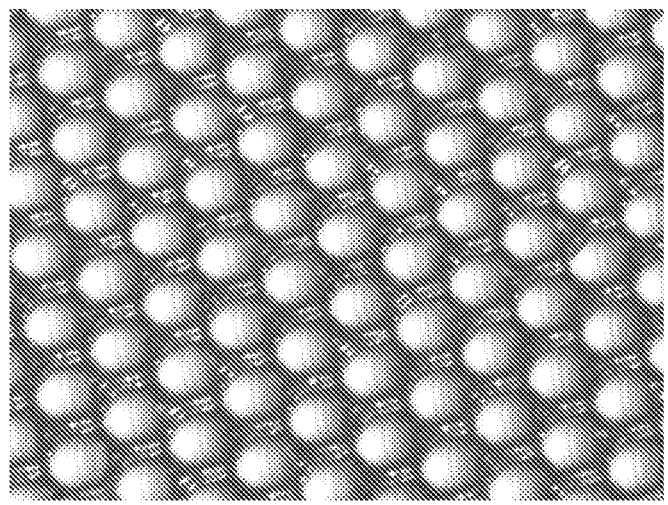
FIG. 13 is an optical micrograph of a microstructure on a structured surface region.
Figure 14:
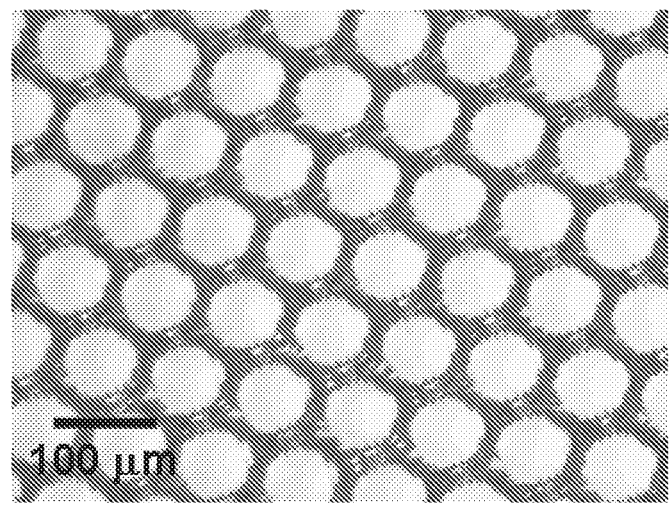
FIG. 14 is an optical micrograph of an article comprising a microstructure of FIG. 13 having a refractive index matching material.

A pre-plating solution was prepared. Palladium acetate $(Pd(OAc)_2)$; 0.24 grams; Alfa Aesar, Ward Hill, Mass.) and cellulose acetate (1.36 grams; Sigma Aldrich, St. Louis, Mo.) were dissolved in acetone (98.4 grams; Sigma Aldrich, St. Louis, Mo.) to form the pre-plating solution. The pre-plating solution was deposited with a pipette onto a microlens array film, similar to that commercially available under the trade designation MICRO OPTICS MICROLENS ARRAYS (Leister Process Technologies; Sarnen, Switzerland). The pre-plating solution was subsequently drawn down with a wire-wound Meyer Rod (4 mil (100 micrometers); R.D. Specialties, Incorporated, Webster, N.Y.) to provide a coating. The coating on the substrate was left undisturbed until the acetone was evaporated from the coating such that the substrate was dry to the touch forming a sample. The sample was dried at 30 seconds at room temperature and atmospheric pressure. After the sample was dried, it was placed into a copper containing electroless plating bath (M85-System; MacDermid Incorporated, Waterbury, Conn.) for approximately four minutes. The sample was removed from the electroless plating bath, washed with deionized water (Sigma Aldrich, St. Louis, Mo.), and dried in air under room temperature and atmospheric pressure. Optical micrograph FIG. 13 illustrates the recessed features containing a metal layer. After drying, the sample having a microstructure was backfilled with a UV (ultraviolet)-curable acrylate resin available under the trade designation 3M EAGLE Resin (3M Company, St. Paul, Minn.). The microstructure of the microlens array film was backfilled by laminating the UV-curable acrylate resin between a sheet of polyethylene terephthalate ((PET); Eastman Chemical Company, Kingsport, Tenn.) and the microlens array film to form a laminated structure. The laminated structure was placed into a Fusion UV curing chamber (Model MC-6RQN; Fusion UV Systems, Gaithersburg, Md.). The UV curable resin acrylate was polymerized with UV radiation (H-bulb). Optical micrograph FIG. 14 illustrates the microlens array substrate of FIG. 13 after backfilling.

The PET sheet was removed from the laminated structure. The copper microstructure (e.g., copper traces) within the recessed features of the microlens array film were measured with a light microscope (Leica Reichert Polyvar 2; Leica, Allendale, N.J.). The width of the copper microstructures was about 5 to 15 micrometers. The electrical sheet resistance of the copper microstructure of the microlens array film was measured to be about 0.25 to 2.5 ohms/square.

Example 3

A resist solution was prepared. Futurrex NR9-1000PY solution (15 grams; Futurrex, Inc., Franklin, N.J.) was dissolved in methyl ethyl ketone ((MEK) 85 grams; Sigma Aldrich, St. Louis, Mo.) to form the resist solution. A metallized structured surface region on a substrate was prepared by vapor coating a uniform layer of copper onto a prismatic film available under the trade designation VIKUITI 90/24 BRIGHTNESS ENHANCEMENT FILM II (3M Company, Display and Graphics Division, Maplewood, Minn.) to form a metallized prismatic film. The electrical sheet resistance was measured to be about 0.5 to about 5.0 ohms/square.

The resist solution was die-coated onto the metallized prismatic film described above. The film was moving at a rate of 2 m/min with the resist solution having a flow rate of 1.6 $cm^3$/minute. The resist solution was applied to a width of about 10.5 cm. The resist solution on the substrate was left undisturbed until the MEK was evaporated from the coating such that the substrate was dry to the touch forming a sample under ambient conditions.

An aqueous etchant bath was prepared by adding 100 grams of etchant (Microclean Etch; Rohm & Haas, Philadelphia, Pa.) to one liter of deionized water. The aqueous etchant bath was stirred for 45 seconds to mix the etchant in deionized water. After mixing the aqueous etchant bath, the metallized prismatic film was placed into the aqueous etchant bath for about 20 seconds to form an etched metallized prismatic film. The etched metallized prismatic film was removed from the aqueous etchant bath, washed in deionized water for two minutes, and dried at room temperature and atmospheric pressure. After drying, the etched metallized prismatic film was backfilled with a UV (ultraviolet)-curable acrylate resin available under the trade designation 3M EAGLE Resin (3M Company, St. Paul, Minn.). The microstructure of the etched metallized prismatic film was backfilled by laminating the UV-curable acrylate resin between a sheet of polyethylene terephthalate ((PET); Eastman Chemical Company, Kingsport, Tenn.) and the etched metallized prismatic film to form a laminated structure. The laminated structure was placed into a Fusion UV curing chamber (Model MC-6RQN; Fusion UV Systems, Gaithersburg, Md.). The UV curable resin acrylate was polymerized with UV radiation (H-bulb).

Figure 15:
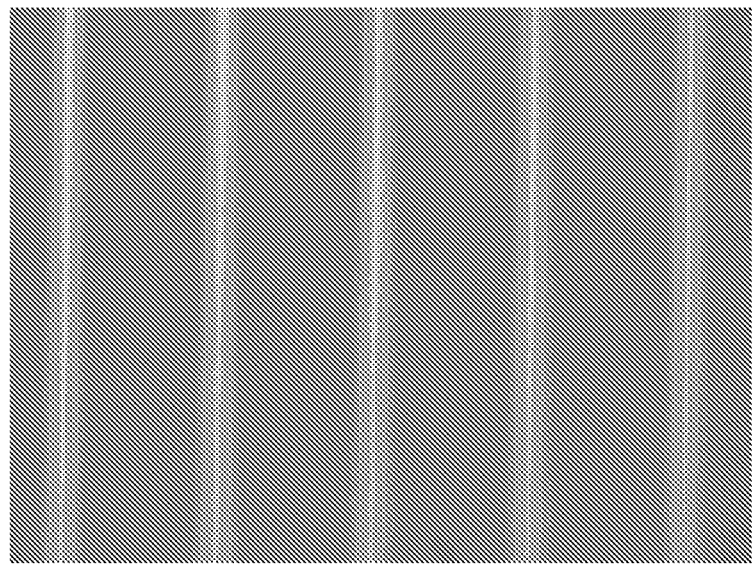
FIG. 15 is an optical micrograph of a microstructure on a structured surface region.

The PET sheet was removed from the laminated structure. The copper microstructure (e.g., copper traces) within the recessed features of the etched metallized prismatic film was measured with a light microscope (Leica Reichert Polyvar 2; Leica, Allendale, N.J.). The width of the copper microstructures was about 4 to 10 micrometers as illustrated in optical micrograph FIG. 15. The electrical sheet resistance of a 1 inch (2.54 cm) wide array of copper microstructures was measured to be about 4 to about 10 ohms/square.

Example 4

A resist solution was prepared. Futurrex NR9-1000PY solution (25 grams; Futurrex, Inc., Franklin, N.J.) was dissolved in methyl ethyl ketone ((MEK) 85 grams; Sigma Aldrich, St. Louis, Mo.) to form the resist solution. A metallized structured surface region on a substrate was prepared by vapor coating a uniform layer of copper onto a substrate comprising a periodic array of hemispherical-shaped lenslets (e.g., "microlenslets") with a center-to-center spacing of 85 microns. The sheet resistance of the metallized substrate was about 0.5 Ohm/Square to 5 Ohm/Square.

The resist solution was die-coated onto the metallized substrate described above. The substrate was moving at a rate of about 2 m/min. with the resist solution having a flow rate of about 3.5 cm$^3$/min. Methyl ethyl ketone was evaporated from the coating at room temperature and pressure.

The metallized substrate was placed in the aqueous etchant bath of Example 4 for about two minutes, and dried at room temperature and pressure. The dried etched metallized substrate was backfilled with a UV-curable acrylate resin as described in Example 4 above. The microstructure of the etched metallized prismatic film was backfilled by laminating the UV-curable acrylate resin between a sheet of polyethylene terephthalate ((PET); Eastman Chemical Company, Kingsport, Tenn.) and the etched metallized prismatic film to form a laminated structure. The laminated structure was placed into a Fusion UV curing chamber (Model MC-6RQN; Fusion UV Systems, Gaithersburg, Md.). The UV curable resin acrylate was polymerized with UV radiation (H-bulb).

Figure 16:
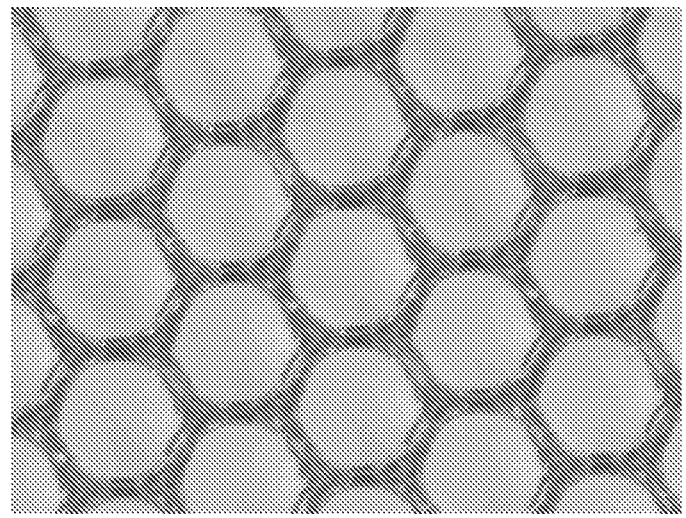
FIG. 16 is an optical micrograph of a microstructure on a structured surface region using a metal-etch process.

The PET sheet was removed from the laminated structure. The copper microstructure (e.g., copper traces) within the recessed features of the etched metallized prismatic film was measured with a light microscope (Leica Reichert Polyvar 2; Leica, Allendale, N.J.) as illustrated in optical micrograph FIG. 16. The width of copper microstructure found in the recessed features of the backfilled substrate was about 5 to 15 microns.

Example 5

A silver ink solution was prepared. Cabot CCI-300 silver conductive ink (1 gram; Cabot Superior MicroPowders, Albuquerque, N. Mex.) was mixed with 15 grams of weight methyl ethyl ketone ((MEK) 85 grams; Sigma Aldrich, St. Louis, Mo.) to form the silver ink solution.

The silver ink solution was deposited with a pipette onto a prismatic film available under the trade designation VIKUITI 90/50 BRIGHTNESS ENHANCEMENT FILM II (3M Company, Display and Graphics Division, Maplewood, Minn.). The silver ink solution was subsequently drawn down with a wire-wound Meyer Rod (4 mil (100 micrometers); R.D. Specialties, Incorporated, Webster, N.Y.) to provide a coated prismatic film. The methyl ethyl ketone was evaporated from the film for approximately 1 minute at room temperature and atmospheric pressure.

Figure 17:
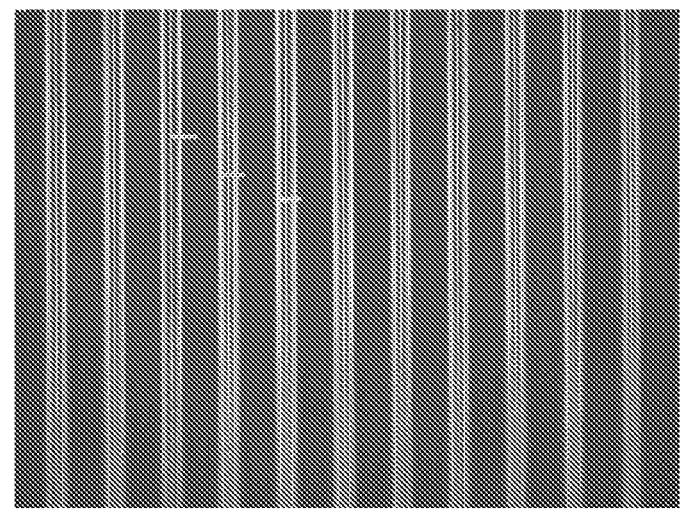
FIG. 17 is an optical micrograph of a microstructure on a structured surface region using a conductive ink.

After the coated prismatic film was dried, the substrate was heated to 100° C. for 15 minutes to cure the silver ink. After drying, the film was backfilled with an UV (ultraviolet)-curable acrylate resin available under the trade designation 3M EAGLE Resin (3M Company, St. Paul, Minn.). The microstructure of the prismatic film was backfilled by laminating the UV-curable acrylate resin between a sheet of polyethylene terephthalate ((PET); Eastman Chemical Company, Kingsport, Tenn.) and the prismatic film to form a laminated structure. The laminated structure was placed into a Fusion UV curing chamber (Model MC-6RQN; Fusion UV Systems, Gaithersburg, Md.). The UV curable resin acrylate was polymerized with UV radiation (H-bulb). The laminated construction was then placed into a Fusion UV Curing chamber (Model MC-6RQN, Fusion UV Systems, Gaithersburg, Md.) and the acrylate was polymerized with UV radiation emitted from an H-bulb. The width of the silver microstructures located in the recessed features of the prismatic film as measured with a light microscope (Leica Reichert Polyvar 2, Leica, Allendale, N.J.) was about 10 to 25 micrometers as illustrated in optical micrograph FIG. 17.

Prophetic Example

A method for forming a microstructure using a "lift-off" procedure is disclosed. A solution would contain a lift-off material such as Futurrex NR9-1000PY (25 grams; Futurrex, Inc., Franklin, N.J.) and dissolving in methyl ethyl ketone ((MEK) 85 grams; Sigma Aldrich, St. Louis, Mo.) for forming a lift-off solution. The lift off solution could be coated onto a prismatic film available under the trade designation VIKUITI 90/50 BRIGHTNESS ENHANCEMENT FILM II (3M Company, Display and Graphics Division, Maplewood, Minn.). The silver ink solution could be drawn down with a wire-wound Meyer Rod (4 mil (100 micrometers); R.D. Specialties, Incorporated, Webster, N.Y.) to provide a coated prismatic film. The methyl ethyl ketone could be evaporated from the film such that the lift off material resides in the recessed channels of the film. Copper could be deposited by an evaporative coater onto the coated prismatic film. The copper could conformally cover the entire film including the lift-off material deposited in the recessed channels of the prismatic film. The metal coated prismatic film could be washed with methyl ethyl ketone to dissolve the lift off material and the copper attached to the lift off material in the recessed channels. The copper layer could remain on the protrusive surfaces (e.g., surfaces free of the lift off material.

Various modifications and alterations of this disclosure will be apparent to those skilled in the art without departing from the scope and spirit of this disclosure, and it should be understood that this disclosure is not limited to the illustrative elements set forth herein.

What is claimed is:

1. A method of forming a microstructure comprising:
   providing a transparent substrate having a structured surface region comprising one or more recessed features with recessed surfaces, the structured surface region substantially free of plateaus;
   disposing a fluid composition comprising a functional material and a liquid onto the structured surface region, wherein the functional material comprises a metal, a metal precursor, an electroless plating catalyst, an electroless plating catalyst precursor, a mask material, or a combination thereof;
   evaporating liquid from the fluid composition, the functional material collecting on the recessed surfaces such that the remainder of the structured surface region is substantially free of the functional material; and
   backfilling the recessed features with a refractive index matching material.

2. The method of claim 1, wherein the functional material comprises the mask material; and
   wherein before backfilling the recessed features, the method further comprises:
       depositing a metal layer on the mask material collected on the recessed surfaces of the recessed features and on the remainder of the structured surface region which is substantially free of the mask material;
       removing the mask material and the metal layer deposited on the mask material from the structured surface region by dissolving, heating, degrading, or combinations thereof, such that the metal layer deposited on the remainder of the structured surface region remains.

3. The method of claim 1, wherein the fluid composition comprises a conductive ink.

4. The method of claim 3, further comprising curing the conductive ink after evaporating liquid from the fluid composition.

5. The method of claim 1, further comprising electrolessly plating the structured surface region.

6. The method of claim 1, further comprising curing the functional material after evaporating liquid from the fluid composition.

7. The method of claim 1, further comprising electrolessly plating the functional material.

8. The method of claim 1, wherein the functional material comprises a mask material in the form of a resist material, further comprising:
    before disposing the fluid composition, disposing a metal layer on the structured surface region to give a metallized structured surface region comprising one or more recessed features having recessed surfaces and a remainder of the metallized structured surface region; and
    after disposing the fluid composition and before backfilling, etching the metal layer of the remainder of the metallized structured surface region, wherein the resist material on the recessed surfaces of the recessed features protects the metal layer disposed beneath the resist material during etching.

9. The method of claim 1, wherein the functional material comprises a mask material in the form of a resist material, further comprising:
    before disposing the fluid composition, disposing a metal layer on the structured surface region to give a metallized structured surface region comprising one or more recessed features having recessed surfaces and a remainder of the metallized structured surface region; and
    removing at least a portion of the metal layer of the remainder of the metallized structured surface region.

* * * * *

UNITED STATES PATENT AND TRADEMARK OFFICE
CERTIFICATE OF CORRECTION

PATENT NO.         : 8,703,232 B2
APPLICATION NO.    : 13/001718
DATED              : April 22, 2014
INVENTOR(S)        : Matthew Stay It is certified that error appears in the above-identified patent and that said Letters Patent is hereby corrected as shown below:

Title Page 2, References Cited Column 2 (Other Publications)
Lines 5-6, delete "Comgining" and insert -- Combining --, therefor.

Line 7, delete "Wienheim," and insert -- Weinheim, --, therefor.

In the Specification

Column 1
Lines 4-8, delete "RELATED APPLICATIONS
The present application claims priority to U.S. Provisional Application Ser. No. 61/076,731, filed Jun. 30, 2008." and insert
-- CROSS REFERENCE TO RELATED APPLICATIONS
This application is a national stage filing under 35 U.S.C. 371 of PCT/US2009/048571, filed June 25, 2009, which claims priority to U.S. Provisional Application No. 61/076,731, filed June 30, 2008, the disclosure of which is incorporated by reference in its/their entirety herein. --, therefor.

Column 4
Line 58, delete "0.1 m$^{-1}$," and insert -- 0.1 m$^{-1}$. --, therefor.

Column 11
Line 52, delete "at" and insert -- a --, therefor.

Column 12
Line 3, delete "FIG. 3B2" and insert -- Fig. 3 B2 --, therefor.

Signed and Sealed this
Second Day of December, 2014

Michelle K. Lee
*Deputy Director of the United States Patent and Trademark Office*

Column 13

Line 15, delete "ti-," and insert -- di-, --, therefor.

Line 16, delete "tri-enanolamine," and insert -- tri-ethanolamine, --, therefor.

Column 14

Line 37, delete "napthalates)," and insert -- naphthalates), --, therefor.